US010037989B1

(12) United States Patent
Cheng et al.

(10) Patent No.: US 10,037,989 B1
(45) Date of Patent: Jul. 31, 2018

(54) III-V LATERAL BIPOLAR INTEGRATION WITH SILICON

(71) Applicant: INTERNATIONAL BUSINESS MACHINES CORPORATION, Armonk, NY (US)

(72) Inventors: Cheng-Wei Cheng, White Plains, NY (US); Sanghoon Lee, Yorktown Heights, NY (US); Effendi Leobandung, Stormville, NY (US); Renee T. Mo, Yorktown Heights, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/794,567

(22) Filed: Oct. 26, 2017

(51) Int. Cl.
*H01L 27/06* (2006.01)
*H01L 29/78* (2006.01)
*H01L 29/73* (2006.01)
*H01L 29/205* (2006.01)
*H01L 21/3105* (2006.01)
*H01L 29/66* (2006.01)
*H01L 29/737* (2006.01)

(52) U.S. Cl.
CPC .... *H01L 27/0623* (2013.01); *H01L 21/31053* (2013.01); *H01L 29/205* (2013.01); *H01L 29/6656* (2013.01); *H01L 29/66318* (2013.01); *H01L 29/66545* (2013.01); *H01L 29/66795* (2013.01); *H01L 29/7302* (2013.01); *H01L 29/737* (2013.01); *H01L 29/785* (2013.01)

(58) Field of Classification Search
CPC .............. H01L 27/0623; H01L 29/737; H01L 29/6656; H01L 29/66545; H01L 29/66318; H01L 21/31053; H01L 29/205; H01L 29/7302; H01L 29/785; H01L 29/66795
See application file for complete search history.

(56) References Cited

U.S. PATENT DOCUMENTS

| 9,048,318 | B2 * | 6/2015 | Leobandung | ......... H01L 29/785 |
| 9,209,095 | B2 * | 12/2015 | Chang | ................... H01L 21/225 |
| 9,263,583 | B2 * | 2/2016 | Cai | ........................ H01L 29/785 |
| 9,496,184 | B2 * | 11/2016 | Chang | ................. H01L 21/8249 |
| 9,525,027 | B2 * | 12/2016 | Hashemi | ............. H01L 29/1008 |

(Continued)

*Primary Examiner* — Earl Taylor
(74) *Attorney, Agent, or Firm* — F. Chau & Associates, LLC

(57) ABSTRACT

A method of manufacturing a semiconductor structure is provided. Spacers on sidewalls of mandrels in a bipolar junction transistor (BJT) region, fins and source/drain structures in a field effect transistor (FET) region, and sacrificial gate structures in the BJT and FET regions are formed on a substrate. Functional gate structures are formed to replace the sacrificial gate structures in the FET region. After replacing the sacrificial gate structures in the FET region, first III-V semiconductor patterns are formed on the sidewalls of the mandrels to replace the spacers in the BJT region. Second III-V semiconductor patterns are formed on sidewalls and tops of the first III-V semiconductor patterns and between the sacrificial gate structures. Then, base contacts are formed to replace the sacrificial gate structures in the BJT region. The semiconductor structure manufactured having FinFET and BJT is also provided.

20 Claims, 19 Drawing Sheets

(56) References Cited

U.S. PATENT DOCUMENTS

| | | | | |
|---|---|---|---|---|
| 9,530,777 B2* | 12/2016 | Loubet | ................ | H01L 27/0886 |
| 9,627,271 B1* | 4/2017 | Leobandung | ... | H01L 21/823821 |
| 9,812,370 B2* | 11/2017 | Chang | ................ | H01L 21/8249 |
| 2015/0061013 A1* | 3/2015 | Basu | .................... | H01L 29/785 |
| | | | | 257/347 |
| 2015/0102348 A1* | 4/2015 | Cai | ...................... | H01L 29/785 |
| | | | | 257/69 |
| 2015/0287650 A1* | 10/2015 | Chang | ................ | H01L 21/225 |
| | | | | 438/236 |
| 2016/0268158 A1* | 9/2016 | Leobandung | ....... | H01L 21/7682 |
| 2017/0141220 A1* | 5/2017 | Ching | .................. | H01L 29/0649 |
| 2017/0243782 A1* | 8/2017 | Wu | .................. | H01L 21/76283 |

* cited by examiner

*BJT Region*

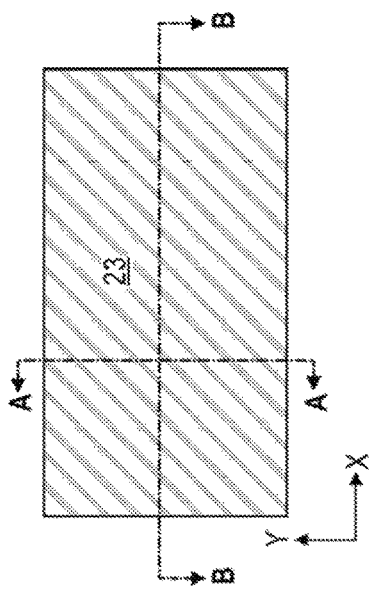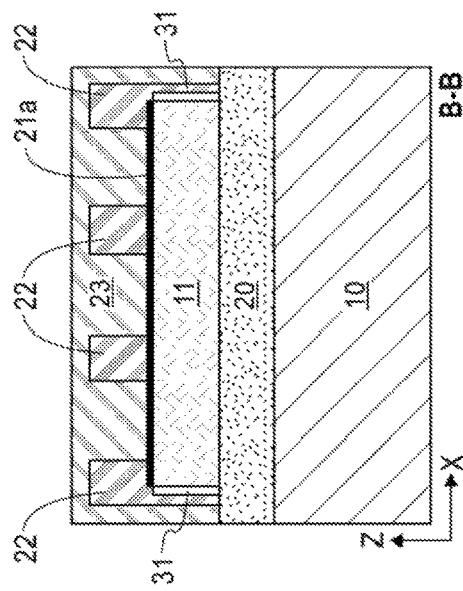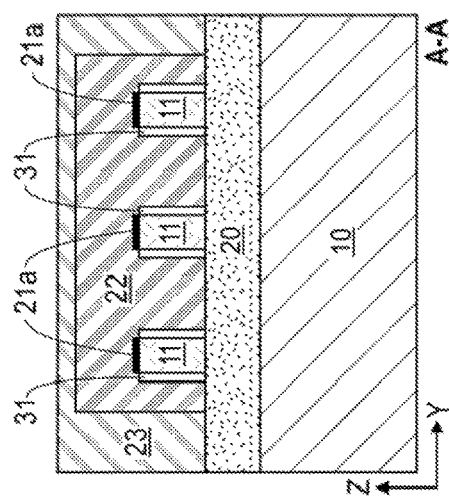
FIG. 6A
FIG. 6B
FIG. 6C

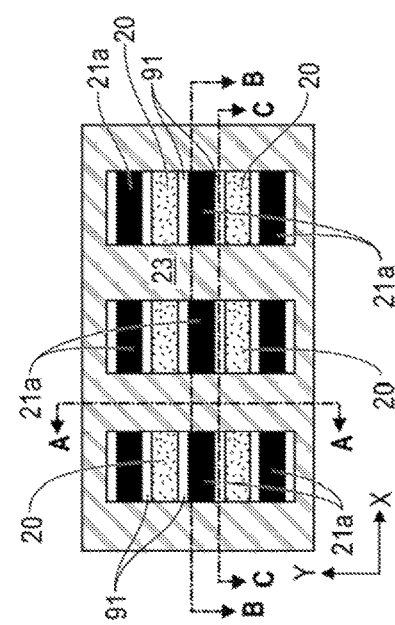
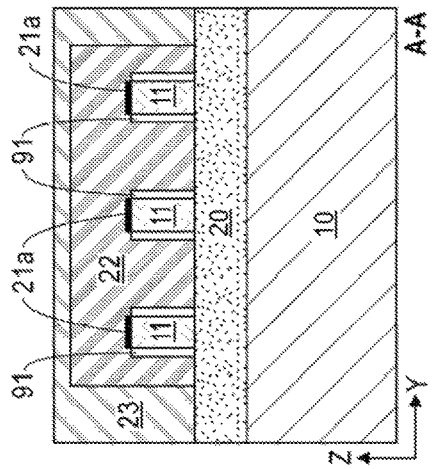
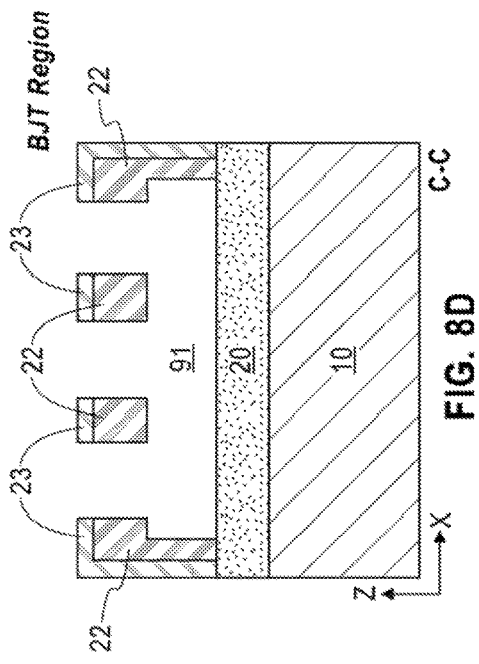
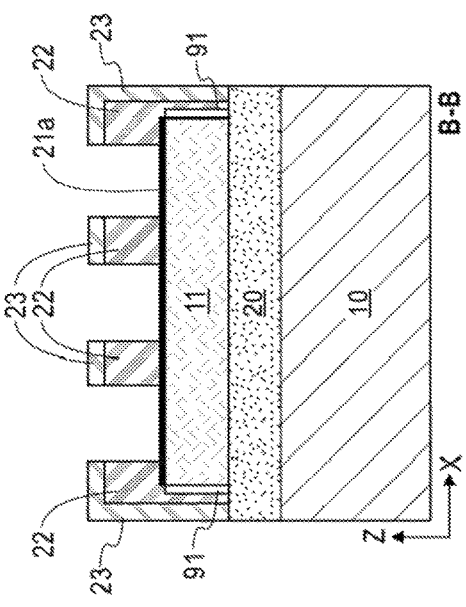

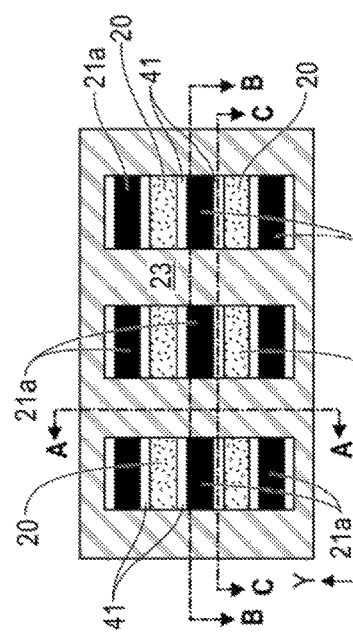
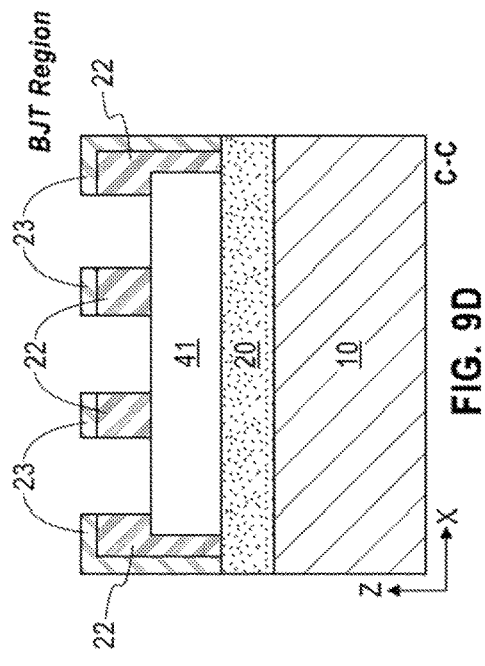
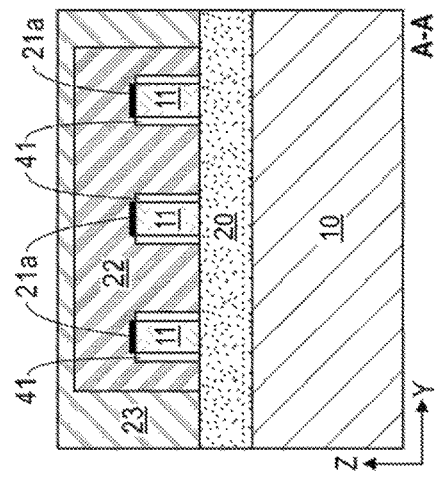
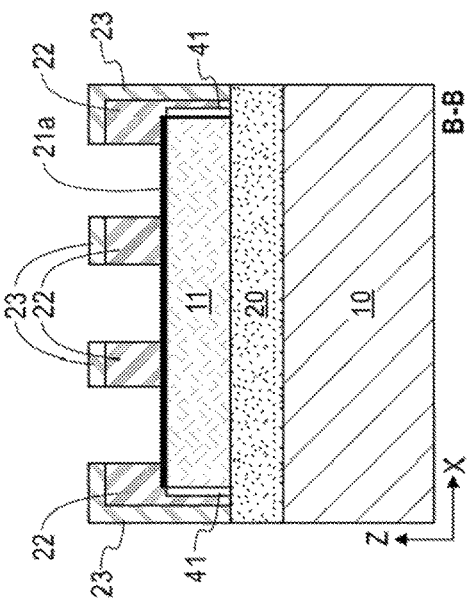
FIG. 9A
FIG. 9B
FIG. 9C
FIG. 9D

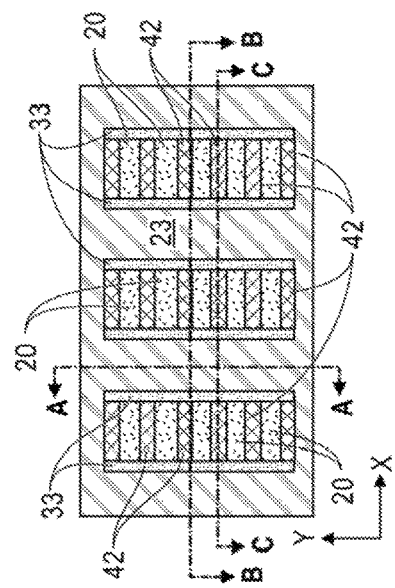
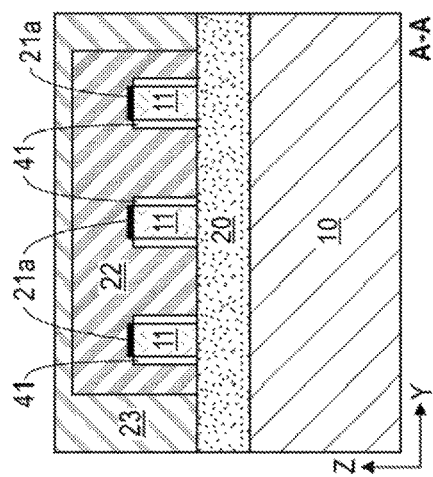
FIG. 12A
FIG. 12B
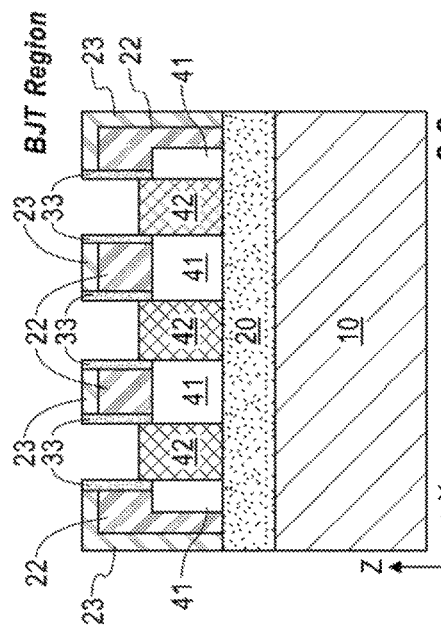
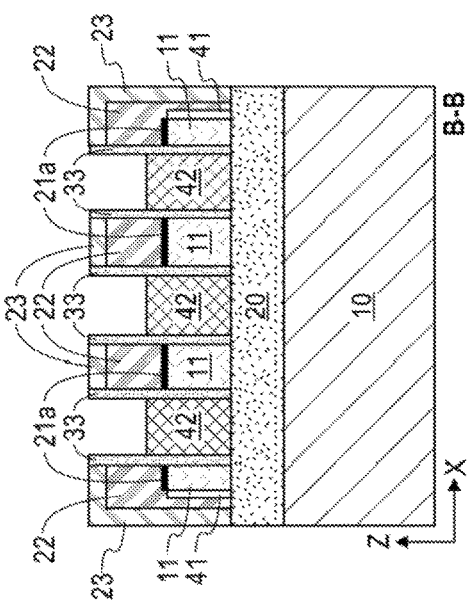
FIG. 12D
FIG. 12C

III-V LATERAL BIPOLAR INTEGRATION WITH SILICON

FIELD OF THE INVENTION

The present invention relates generally to a method of manufacturing a semiconductor structure and the semiconductor structure manufactured, and more particularly to a method of manufacturing a laterally grown III-V bipolar junction transistor (BJT) structure in a bipolar complementary metal-oxide-semiconductor (BiCMOS) structure and the BiCMOS structure manufactured.

BACKGROUND OF THE INVENTION

Fin field effect transistor (FinFET) is superior over bulk metal oxide semiconductor FET (MOSFET) in the aspects of: reduced leakage, excellent sub-threshold slop, and better voltage gain without degradation of noise or linearity. Therefore, FinFET structure is desired device architecture for high end devices such as microprocessors. A FinFET is a unipolar transistor which only uses one kind of charge carrier. On the other hand, a bipolar junction transistor (BJT) uses both electron and hole charge carriers. The BJT may be manufactured in two types, NPN and PNP, and may be used as, for example, an amplifier or a switch for variety of electronic devices. An NPN BJT includes two regions of N-type semiconductor material constituting the emitter and collector regions, and a region of P-type semiconductor material located between the two regions of N-type semiconductor material constituting the base region. A PNP BJT consists one region of N-type semiconductor material between two regions of P-type semiconductor material.

To take advantage of the positive characteristics of the above described two types of transistors, FinFETs may be combined with BJTs in bipolar complementary metal-oxide-semiconductor (BiCMOS) integrated circuits. III-V semiconductors are promising materials for BiCMOS devices because of their high-carrier mobility. In the process of forming the BiCMOS devices, III-V semiconductors may be grown from a sidewall of a semiconductor mandrel structure. The grown III-V semiconductors described above may not be compatible with silicon device which usually requires high processing temperatures. As such, there is a need for providing a method in which III-V semiconductors can be grown from a sidewall of a semiconductor mandrel structure without being subjected to the high processing temperatures typically used in forming the silicon devices.

SUMMARY OF THE INVENTION

According to an aspect of the present invention, there is provided a method of manufacturing a semiconductor structure including: providing a substrate having mandrels in a bipolar junction transistor (BJT) region, and fins in a field effect transistor (FET) region, the mandrels and the fins extending in a first direction and spaced apart in a second direction crossing the first direction; forming first spacers on sidewalls of the mandrels in the BJT region; forming sacrificial gate structures extending in the second direction crossing the mandrels in the BJT region, and crossing the fins in the FET region; forming source/drain structures on exposed sidewalls of the fins in the FET region; forming an interlayer dielectric (ILD) material to cover the sacrificial gate structures and the source/drain structures in the BJT and FET regions; forming functional gate structures to replace the sacrificial gate structures in the FET region; forming first III-V semiconductor patterns on the sidewalls of the mandrels to replace the first spacers in the BJT region; forming second III-V semiconductor patterns on sidewalls and tops of the first III-V semiconductor patterns and between the sacrificial gate structures in the BJT region; and forming base contacts to replace the sacrificial gate structures and the mandrels covered by the sacrificial gate structures in the BJT region.

In the method of manufacturing the semiconductor structure, the forming of the first III-V semiconductor patterns in the BJT region may be performed after the forming of the functional gate structures in the FET region. The first III-V semiconductor patterns may include a first III-V semiconductor, the second III-V semiconductor patterns may include a second III-V semiconductor, and the first III-V semiconductor may be different from the second III-V semiconductor. The first III-V semiconductor may be N-type and the second III-V semiconductor may be P-type, or the first III-V semiconductor may be P-type and the second III-V semiconductor may be N-type. The second III-V semiconductor patterns may include two different III-V semiconductors on opposite sides of each of the base contacts. The first III-V semiconductor patterns may be bases of bipolar junction transistors (BJTs), and each of the second III-V semiconductor patterns may be one of a collector and an emitter of one of the BJTs. The forming of the functional gate structures in the FET region may include: removing the ILD material above the sacrificial gate structures in the FET region; removing the sacrificial gate structures in the FET region to form cavities; and depositing the functional gate structures in the cavities. The forming of the first III-V semiconductor patterns may include: recessing the ILD material between the sacrificial gate structures in the BJT region; isotropically etching away the first spacers from the sidewalls of the mandrels in the BJT region; and growing the first III-V semiconductor patterns on the sidewalls of the mandrels in the BJT region. The forming of the second III-V semiconductor patterns may include: performing mandrel pull between the sacrificial gate structures in collector/emitter area in the BJT region; and epitaxially growing the second III-V semiconductor patterns on the sidewalls and the tops of the first III-V semiconductor patterns between the sacrificial gate structures in the collector/emitter area in the BJT region. The forming of the second III-V semiconductor patterns may further include forming second spacers on exposed sidewalls of the sacrificial gate structures and exposed sidewalls of the mandrels. The forming of the base contacts in the BJT region may include: depositing the ILD material over the substrate to fill all spaces among the mandrels, the sacrificial gate structures, and the first and second III-V semiconductor patterns; planarizing top surface of the ILD material; recessing the top surface of the ILD material to access the sacrificial gate structure in the BJT region; removing the sacrificial gate structures in the BJT region; performing mandrel pull to remove all remaining mandrels in the BJT region; and depositing the base contacts to fill spaces after mandrel pull, and planarizing top surfaces of the base contacts.

According to another aspect of the present invention, there is provided a method of manufacturing a semiconductor structure including: providing a substrate including a field effect transistor (FET) region and a bipolar junction transistor (BJT) region; forming a plurality of fins in the FET region on the substrate extending in a first direction and spaced apart in a second direction crossing the first direction, a plurality of functional gate structures spaced apart in the first direction and extending in the second direction crossing the plurality of fins in the FET region, a source and a drain formed on opposite sides of each of the plurality of functional gate structures in the FET region, a plurality of mandrels having first spacers on sidewalls in the BJT region on the substrate extending in the first direction and spaced apart in the second direction, and a plurality of sacrificial gate structures spaced apart in the first direction and extending in the second direction crossing the plurality of mandrels in the BJT region, and an interlayer dielectric (ILD) material covering the plurality of the sacrificial gate structures, the sources and the drains in the BJT and FET regions; forming a plurality of fin-type bases on the sidewalls of the plurality of mandrels to replace the first spacers in the BJT region, while masking the FET region; forming a collector and an emitter on sidewalls and tops of each of the plurality of fin-type bases at opposite sides of each of the plurality of sacrificial gate structures in the BJT region; forming a plurality of base contacts to replace the plurality of sacrificial gate structures and the plurality of mandrels covered by the plurality of sacrificial gate structures in the BJT region, in which the plurality of fins include a group IV semiconductor, and the plurality of fin-type bases include a III-V semiconductor including at least one of group III elements of boron (B), gallium (Ga), aluminum (Al) and indium (In), and at least one of group V elements of nitrogen (N), phosphorus (P), arsenic (As), antimony (Sb) and bismuth (Bi).

In the method of manufacturing the semiconductor structure, each of the plurality of fin-type bases may include a P-type III-V semiconductor, and the collector and the emitter may include N-type III-V semiconductors, or each of the plurality of fin-type bases may include an N-type III-V semiconductor, and the collector and the emitter may include P-type III-V semiconductors. The forming of the collector and the emitter may further include forming a plurality of second spacers on exposed sidewalls of the plurality of sacrificial gate structures and exposed sidewalls of the plurality of mandrels. Each of the plurality of fin-type bases may include InGaAs, the collector may include InGaAs, and the emitter may include GaAs.

According to yet another aspect of the present invention, there is provided a semiconductor structure including: a substrate including a field effect transistor (FET) region and a bipolar junction transistor (BJT) region; a plurality of fins in the FET region and a plurality of fin-type bases in the BJT region on the substrate extending in a first direction and spaced apart in a second direction crossing the first direction; a plurality of functional gate structures spaced apart in the first direction and extending in the second direction crossing the plurality of fins in the FET region, and a plurality of base contacts spaced apart in the first direction and extending in the second direction crossing the plurality of fin-type bases in the BJT region; and a source and a drain formed on opposite sides of each of the plurality of functional gate structures in the FET region, and a collector and an emitter formed on opposite sides of each of the plurality of base contacts in the BJT region, in which the plurality of fins include a group IV semiconductor, and the plurality of fin-type bases include a III-V semiconductor including at least one of group III elements of boron (B), gallium (Ga), aluminum (Al) and indium (In), and at least one of group V elements of nitrogen (N), phosphorus (P), arsenic (As), antimony (Sb) and bismuth (Bi).

In the semiconductor structure, the emitter and each of the plurality of fin-type bases may include different III-V semiconductors. Each of the plurality of fin-type bases may include a P-type III-V semiconductor, and the collector and the emitter may include N-type III-V semiconductors. Each of the plurality of fin-type bases may include an N-type III-V semiconductor, and the collector and the emitter may include P-type III-V semiconductors. Each of the plurality of fin-type bases may include InGaAs, the collector may include InGaAs, and the emitter may include GaAs.

BRIEF DESCRIPTION OF THE DRAWINGS

The present invention may best be understood from the following detailed description of preferred embodiments, taken in conjunction with the accompany drawings, and in which:

FIG. 6A is a schematic top-view diagram representing an interlayer dielectric (ILD) material formed to cover the sacrificial gate structures in the BJT region, FIG. 6B is a schematic cross-sectional diagram of FIG. 6A taken along line A-A, FIG. 6C is a schematic cross-sectional diagram of FIG. 6A taken along line B-B.

FIG. 8A is a schematic top-view diagram representing the first spacers isotropically etched away in the BJT region, FIG. 8B is a schematic cross-sectional diagram of FIG. 8A taken along line A-A, FIG. 8C is a schematic cross-sectional diagram of FIG. 8A taken along line B-B, and FIG. 8D is a schematic cross-sectional diagram of FIG. 8A taken along line C-C according to an exemplary embodiment of the present invention;

FIG. 9A is a schematic top-view diagram representing first III-V semiconductor patterns formed on the sidewalls of the mandrels in the BJT region, FIG. 9B is a schematic cross-sectional diagram of FIG. 9A taken along line A-A, FIG. 9C is a schematic cross-sectional diagram of FIG. 9A taken along line B-B, and FIG. 9D is a schematic cross-sectional diagram of FIG. 9A taken along line C-C according to an exemplary embodiment of the present invention;

FIG. 12A is a schematic top-view diagram representing second III-V semiconductor patterns formed on sidewalls and tops of the first III-V semiconductor patterns between the sacrificial gate structures in the collector/emitter areas in the BJT region, FIG. 12B is a schematic cross-sectional diagram of FIG. 12A taken along line A-A, FIG. 12C is a schematic cross-sectional diagram of FIG. 12A taken along line B-B, and FIG. 12D is a schematic cross-sectional diagram of FIG. 12A taken along line C-C according to an exemplary embodiment of the present invention;

Figure 1:
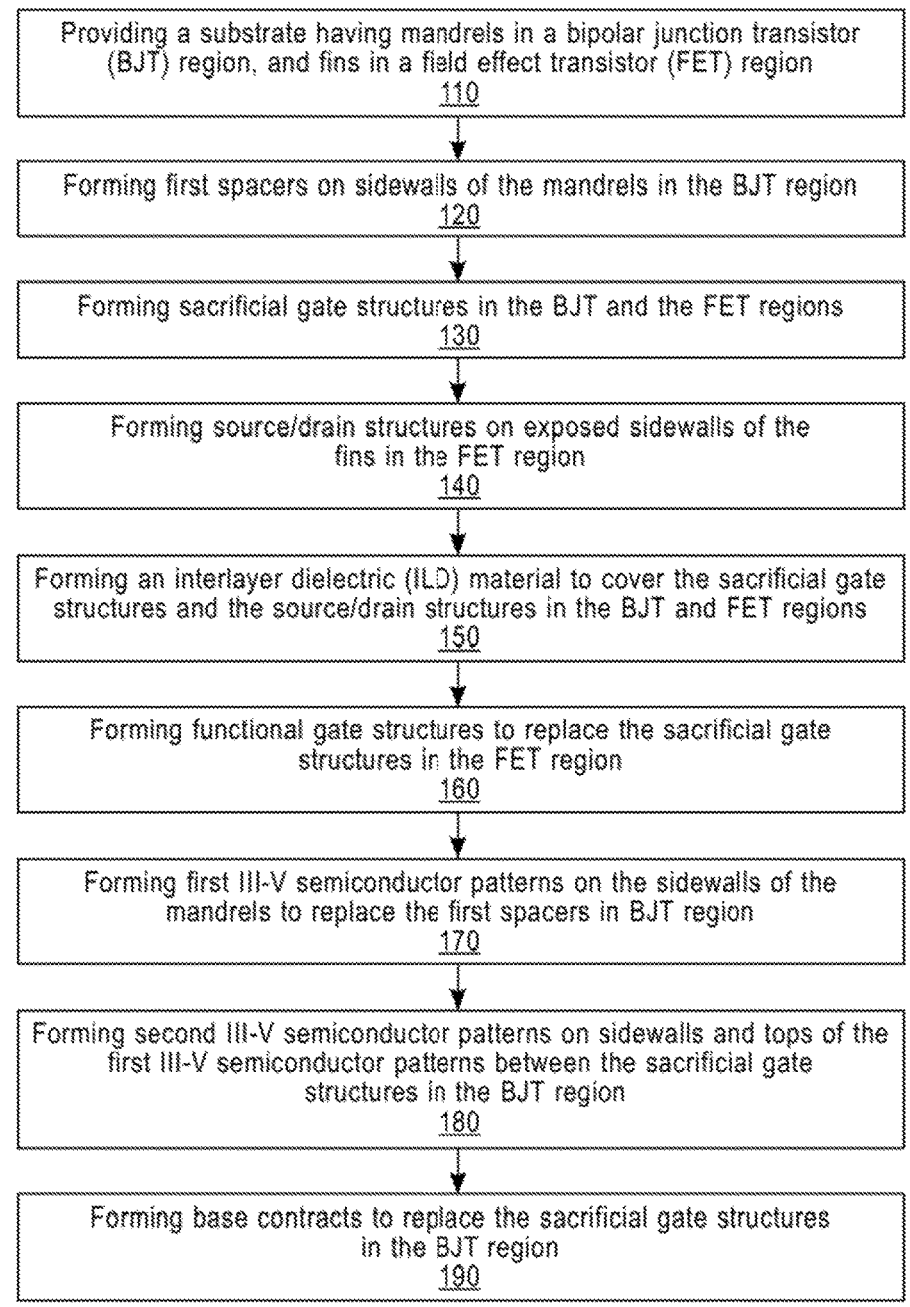
FIG. 1 is a flow chart of a method of manufacturing a semiconductor structure according to an exemplary embodiment of the present invention.

Since the drawings in FIGS. 1-16F are intended for illustrative purpose, the elements in the drawings are not necessarily drawn to scale. For example, some of the elements may be enlarged or exaggerated for clarity purpose.

DETAILED DESCRIPTION OF PREFERRED EMBODIMENTS

The present invention relates generally to a method of manufacturing a semiconductor structure, and the semiconductor structure manufactured. Specifically, the present invention relates to a method of manufacturing a laterally grown III-V bipolar junction transistor (BJT) structure in a bipolar complementary metal-oxide-semiconductor (BiCMOS) structure and the BiCMOS structure manufactured. More specifically, to be compatible with silicon device which requires high processing temperature, III-V semiconductor patterns are grown for the BJT structure after replacement metal gate (RMG) and middle of line (MOL) dielectric processing steps for the field effect transistor (FET) structure in manufacturing the BiCMOS structure. Exemplary embodiments of the present invention provide a method of laterally growing III-V semiconductor patterns in the BJT region after the formation of the functional gate structures in the FET region, so that the grown III-V semiconductor patterns would not incur damage due to the high temperature process steps used in fabricating the silicon device, and also provide a semiconductor structure having the III-V semiconductor patterns in the BJT region.

It will be understood that when an element such as a layer, region or substrate is referred to as being "on" or "over" another element, it can be directly on or over the other element or intervening elements may also be present. In contrast, when an element is referred to as being "directly on" or "directly over" another element, there are no intervening elements present. As used herein, the singular forms "a", "an" and "the" are intended to include the plural forms as well, unless the context clearly indicates otherwise.

According to an exemplary embodiment of the present invention, a method of manufacturing a semiconductor structure may include the following steps: providing a substrate having mandrels in a bipolar junction transistor (BJT) region, and fins in a field effect transistor (FET) region, the mandrels and the fins extending in a first direction and spaced apart in a second direction crossing the first direction; forming first spacers on sidewalls of the mandrels in the BJT region; forming sacrificial gate structures extending in the second direction crossing the mandrels in the BJT region, and crossing the fins in the FET region; forming source/drain structures on exposed sidewalls of the fins in the FET region; forming an interlayer dielectric (ILD) material to cover the sacrificial gate structures and the source/drain structures in the BJT and FET regions; forming functional gate structures to replace the sacrificial gate structures in the FET region; forming first III-V semiconductor patterns on the sidewalls of the mandrels to replace the first spacers in the BJT region; forming second III-V semiconductor patterns on sidewalls and tops of the first III-V semiconductor patterns and between the sacrificial gate structures in the BJT region; and forming base contacts in the BJT region to replace the sacrificial gate structures in the BJT region. The sequence of the steps as described above is preferred. However, the present invention is not limited to the performance of these steps with the sequence or order presented above. Many steps may also be applied to the substrate before, between or after the steps shown above. FIG. 1 is a flow chart of a method of manufacturing a semiconductor structure according to an exemplary embodiment of the present invention. FIGS. 2A-16F are demonstrative illustrations of top views or cross-sectional views of structures in the method of manufacturing the semiconductor structure according to an exemplary embodiment of the present invention.

Figure 2C:
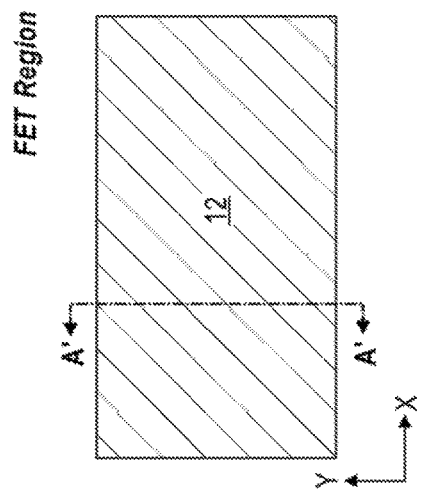
FIG. 2C is a schematic top-view diagram representing the substrate having the SOI structure in a field effect transistor (FET) region.
Figure 2D:
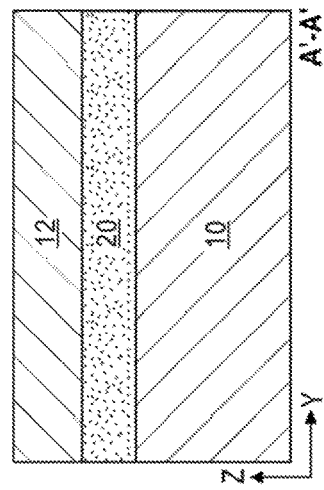
FIG. 2D is a schematic cross-sectional diagram of FIG. 2C taken alone line A'-A' according to an exemplary embodiment of the present invention.
Figure 2A:
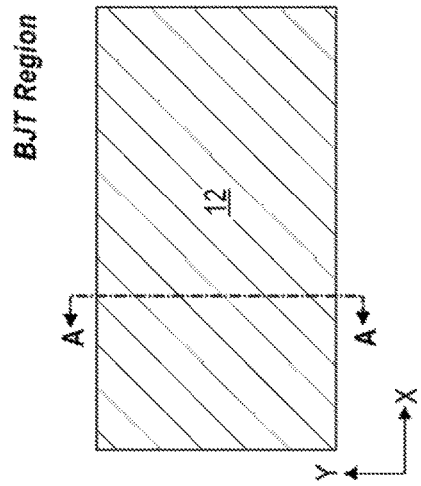
FIG. 2A is a schematic top-view diagram representing a substrate having a semiconductor-on-insulator (SOI) structure in a bipolar junction transistor (BJT) region.
Figure 2B:
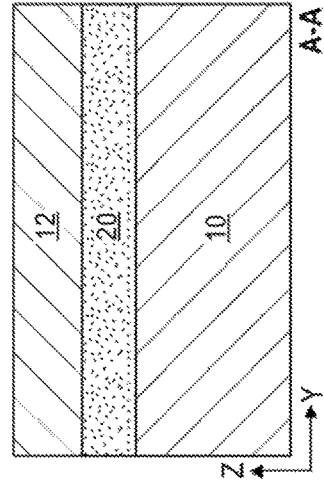
FIG. 2B is a schematic cross-sectional diagram of FIG. 2A taken along line A-A.

At block 110 of FIG. 1, a substrate having mandrels in a bipolar junction transistor (BJT) region, and fins in a field effect transistor (FET) region may be provided. Referring to FIGS. 2A-2D, FIG. 2A is a schematic top-view diagram representing a substrate 10 having a semiconductor-on-insulator (SOI) structure in the BJT region, FIG. 2B is a schematic cross-sectional diagram of FIG. 2A taken along line A-A, FIG. 2C is a schematic top-view diagram representing the substrate 10 having the SOI structure in the FET region, and FIG. 2D is a schematic cross-sectional diagram of FIG. 2C taken alone line A'-A' according to an exemplary embodiment of the present invention. As shown in FIGS. 2B and 2D, the substrate 10 having the SOI structure may include an insulating layer 20 on top of the substrate 10, and a semiconductor layer 12 on top of the insulating layer 20. Collectively, the substrate 10, the insulator layer 20, and the semiconductor layer 12 may be referred to as an SOI substrate. Although the SOI substrate is shown in FIGS. 2A-2D as an exemplary substrate structure, the present invention is not limited thereto. For example, a bulk semiconductor wafer may be provided as a substrate if required.

The substrate 10 may be any suitable substrate, and may include a semiconducting material such as, for example, silicon (Si), germanium (Ge), silicon germanium (SiGe), silicon carbide (SiC), gallium nitride (GaN) or gallium arsenide (GaAs), a non-semiconducting material such as, for example, silicon oxide ($SiO_2$), aluminum (Al), aluminum oxide ($Al_2O_3$), ceramic, quartz, or copper (Cu), or any combination thereof, including multilayers, for example, germanium on silicon. For some applications, the substrate 10 may be a semiconductor substrate doped with impurities to render them P-type or N-type. In a P-doped silicon substrate, the Si substrate may be doped with P-type dopants such as, for example, boron (B), aluminum (Al), gallium (Ga) and indium (In). In an N-doped silicon substrate, the Si substrate may be doped with N-type dopants such as, for example, antimony (Sb), arsenic (As) and phosphorous (P). The preferable substrate material for the substrate 10 is silicon. The semiconductor layer 12 may include group IV semiconductor(s) such as, for example, silicon (Si), germanium (Ge), silicon germanium (SiGe), and/or silicon carbide (SiC). The thickness of the semiconductor layer 12 may be in a range from about 5 nm to about 150 nm, for example, may be in a range from about 10 nm to about 100 nm. The insulating layer 20 may include tetraethyl orthosilicate (TEOS), silicon nitride ($Si_3N_4$), silicon oxide ($SiO_2$), silicon oxynitride (SiON), nanoporous silica, hydrogensilsesquioxanes (HSQ), Teflon-AF (polytetrafluorethylene or PTFE), silicon oxyfluoride (FSG), carbon doped $SiO_2$ (SiCO), hydrogenated silicon oxycarbide (SiCOH), or other low k dielectric materials. The preferable material for the insulating layer 20 is $SiO_2$. The thickness of the insulating layer may be in a range from about 5 nm to about 250 nm, for example, may be in a range from about 50 nm to about 200 nm.

Figure 3C:
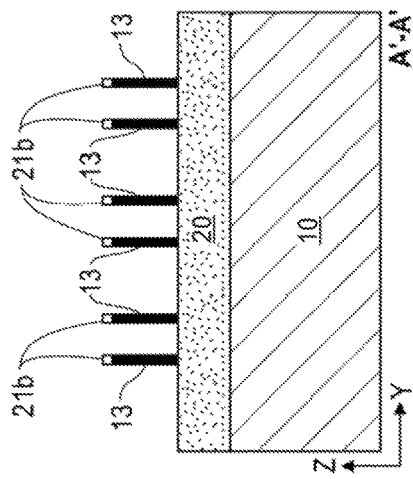
FIG. 3C is a schematic top-view diagram representing fins with second hard mask patterns on top formed on the substrate in the FET region, and FIG. 31) is a schematic cross-sectional diagram of FIG. 3C taken along line A'-A' according to an exemplary embodiment of the present invention.
Figure 3D:
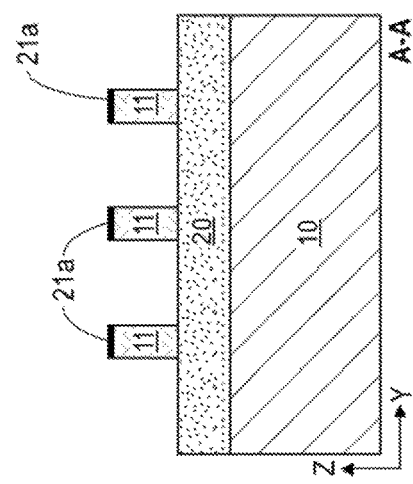
FIG. 3A is a schematic top-view diagram representing mandrels with first hard mask patterns on top formed on the substrate in the BJT region.
FIG. 3B is a schematic cross-sectional diagram of FIG. 3A taken along line A-A.
Figure 3A:
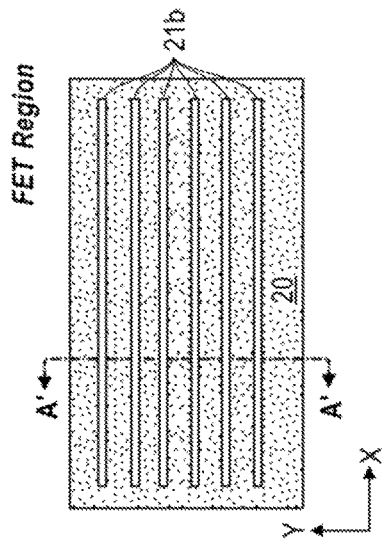
Figure 3B:
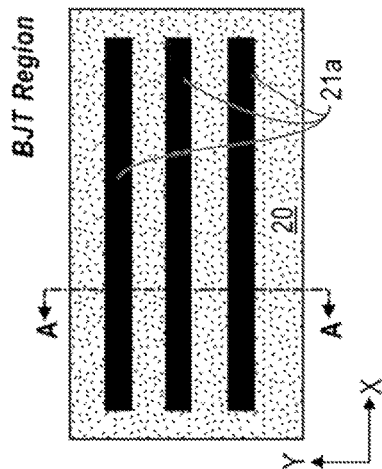

Referring to FIGS. 3A-3D, FIG. 3A is a schematic top-view diagram representing mandrels 11 with first hard mask patterns 21a on top formed on the substrate 10 in the BJT region, FIG. 3B is a schematic cross-sectional diagram of FIG. 3A taken along line A-A, FIG. 3C is a schematic top-view diagram representing fins 13 with second hard mask patterns 21b on top formed on the substrate 10 in the FET region, and FIG. 3D is a schematic cross-sectional diagram of FIG. 3C taken along line A'-A' according to an exemplary embodiment of the present invention. The mandrels 11 are extending in parallel in a first direction (X direction) and spaced apart in a second direction (Y direction) crossing the first direction (X direction) in the BJT region, and the fins 13 are extending in parallel in the first direction (X direction) and spaced apart in the second direction (Y direction) crossing the first direction (X direction) in the FET region. For forming the mandrels 11 in the BJT region, a hard mask layer may be formed on the semiconductor layer 12, followed by patterning the hard mask layer through a photolithographic process and an etching process to form the first hard mask patterns 21a, and then the mandrels 11 may be formed by etching the semiconductor layer 12 with the first hard mask patterns 21a as an etch mask. Thus, each of the first hard mask patterns 21a may have its shape and size the same as those of each mandrel 11 in the X-Y plan. The hard mask layer may include any hard mask material such as, for example, silicon dioxide ($SiO_2$), silicon nitride ($Si_3N_4$) and/or silicon oxynitride (SiON). The thickness of the hard mask layer may be in a range from 5 nm to 30 nm, although lesser and greater thicknesses may also be employed. The hard mask layer may be formed on the semiconductor layer 12 with various deposition processes include, but are not limited to: physical vapor deposition (PVD), chemical vapor deposition (CVD), atomic layer deposition (ALD), and spin coating. A typical photolithographic process may include the following steps: preparing substrate, coating photoresist, baking, exposing and developing. The patterning process may use a positive tone resist with a positive tone development process or may use negative tone development (NTD) process with solvent-based developer. For forming the fins 13 in FET region, a sidewall image transfer (SIT) process may be used to pattern small fin structures with small fin pitches. The SIT process doubles the spatial frequency of a template or a mandrel, is also called self-aligned double patterning (SADP) process. The process involves the deposition of a spacer along the sidewalls of a mandrel followed by etching off the mandrel. The pattern of the template or the mandrel may be obtained with a conventional lithography such as, an ArF (193 nm) deep UV (DUV) immersion lithography. The remaining sidewall features may then be used for patterning the device structures. Through the SIT process, the second hard mask patterns 21b may be formed on the semiconductor layer 12, then the fins 13 may be formed by etching the semiconductor layer 12 with the second hard mask patterns 21b as an etch mask. Thus, each of the second hard mask patterns 21b may have its shape and size the same as those of each fin 13 in the X-Y plan. The patterning of the mandrels 11 and the fins 13 may be separate or together as needed.

Figure 4C:
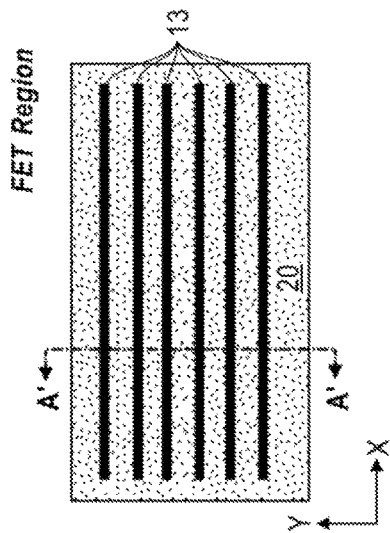
FIG. 4C is a schematic top-view diagram representing the second hard mask patterns removed from the fins in the FET region.
Figure 4D:
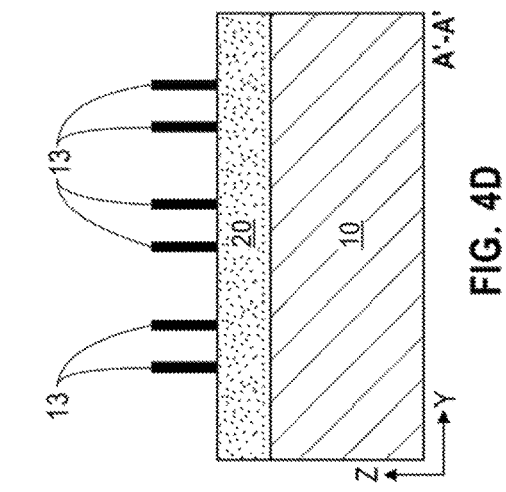
FIG. 4D is a schematic cross-sectional diagram of FIG. 4C taken along line A'-A' according to an exemplary embodiment of the present invention.
Figure 4A:
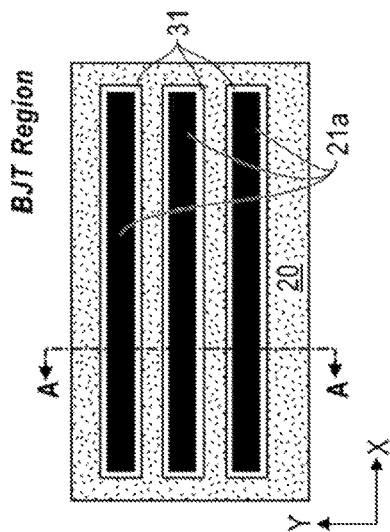
FIG. 4A is a schematic top-view diagram representing first spacers formed on sidewalls of the mandrels in the BJT region.
Figure 4B:
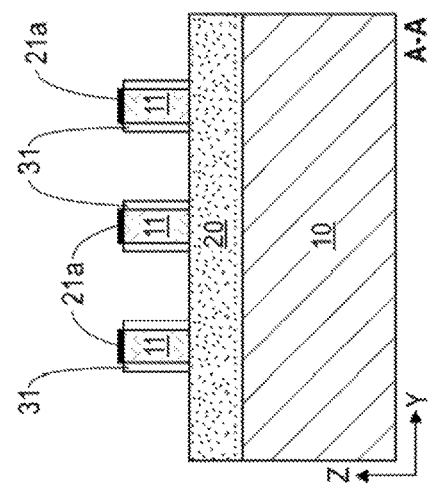
FIG. 4B is a schematic cross-sectional diagram of FIG. 4A taken along line A-A.

At block 120 of FIG. 1, first spacers may be formed on sidewalls of the mandrels 11 in the BJT region. Referring to FIGS. 4A-4D), FIG. 4A is a schematic top-view diagram representing first spacers 31 formed on sidewalls of the mandrels 11 in the BJT region, FIG. 4B is a schematic cross-sectional diagram of FIG. 4A taken along line A-A, FIG. 4C is a schematic top-view diagram representing the second hard mask patterns 21b removed from the fins 13 in the FET region, and FIG. 4D is a schematic cross-sectional diagram of FIG. 4C taken along line A'-A' according to an exemplary embodiment of the present invention. A layer of first spacer material may be formed to cover the surface of the entire top area of the substrate 10 including the exposed top surface of the insulating layer 20, the tops and sidewalls of the mandrels 11 and fins 13, by conformally depositing the first spacer material onto the substrate 10. Examples of deposition processes that may be used in providing the first spacer material may include, for example, CVD, plasma enhanced CVD (PECVD), or ALD. The new layer of the first spacer material may include silicon oxide ($SiO_2$), silicon nitride ($Si_3N_4$), titanium nitride (TiN), boron nitride (BN), amorphous carbon (a-C), metal, and/or metal oxide, and may have a thickness ranging from about 4 nm to about 20 nm and should be proportional to the size of the feature intended to be patterned. The material for the first spacers 31 is chosen so that the material of the mandrels 11 has etch selectivity over the material of the first spacers 31, for example the etch rate for the material of the mandrels 11 is substantially faster than that of the material of the first spacer material under one etch condition. Preferably, the material for the first spacers 31 is silicon nitride. ALD method is suitable for making smooth, conformal layers. To remove the first spacer material such as nitride from the FET region, the BJT region may be masked with an oxide hard mask, followed by nitride wet or dry etch to remove the first spacer material from the FET region, then the oxide hard mask may be stripped. The BJT region may also be masked with an organic hard mask during the removal of the first spacer material in the FET region. In this process, the second hard mask patterns 21b may be removed from the fins 13 in the FET region. To form the first spacers 31 on the sidewalls of the mandrels 11 in BJT region, the conformal nitride layer in BJT region may be etched, for example, by a reactive ion etch (RIE) process. The directional etch may remove the nitride from horizontal top surfaces of all features in the BJT region, and may then leave the nitride on the sidewalls of the mandrels 11 in the BJT region.

Figure 5A:
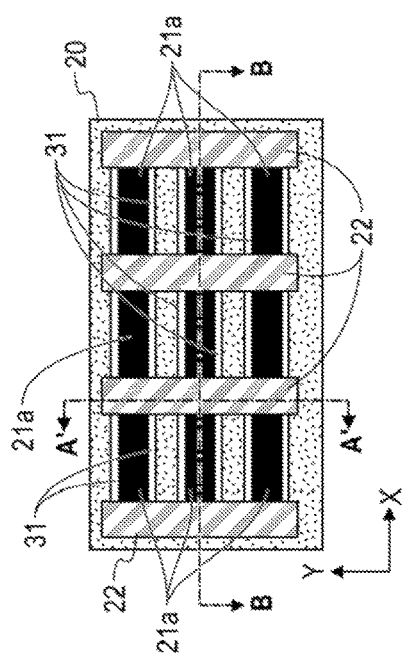
FIG. 5A is a schematic top-view diagram representing sacrificial gate structures crossing the mandrels formed in the BJT region.
Figure 5B:
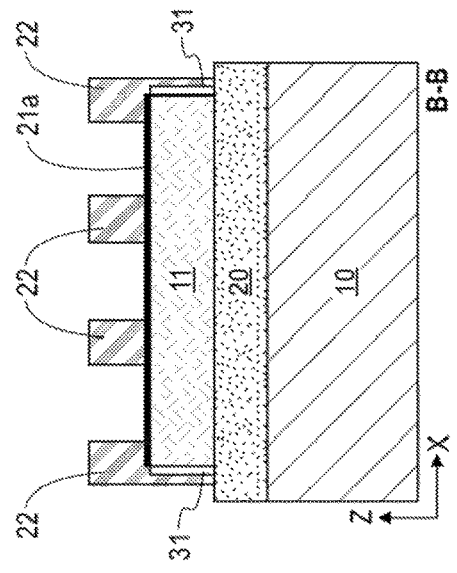
FIG. 5B is a schematic cross-sectional diagram of FIG. 5A taken along line A-A.
Figure 5C:
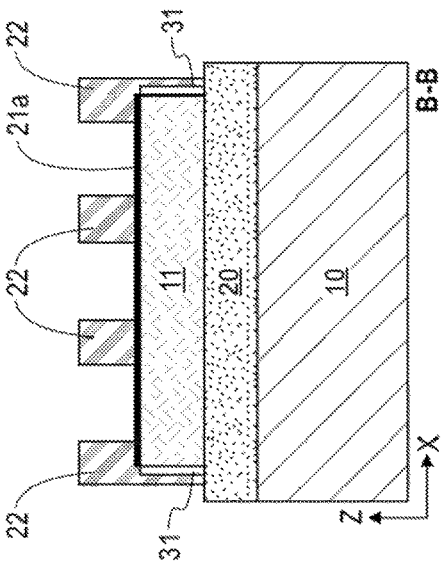
FIG. 5C is a schematic cross-sectional diagram of FIG. 5A taken along line B-B.
Figure 5D:
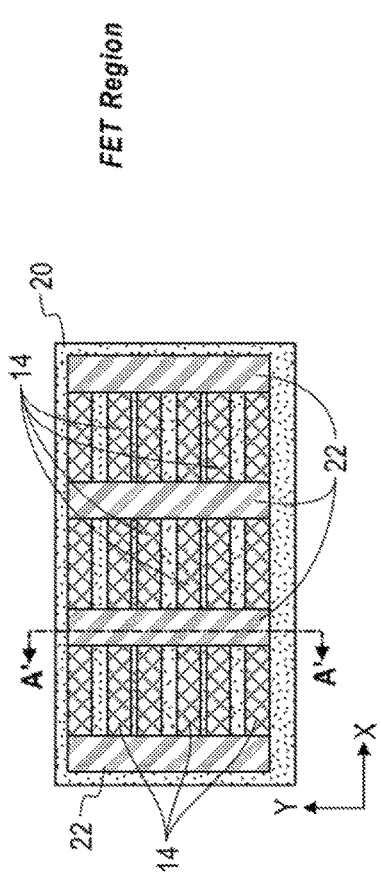
FIG. 5D is a schematic top-view diagram representing the sacrificial gate structures formed crossing the fins and source/drain structures formed on exposed sidewalls of the fins in the FET region.
Figure 5E:
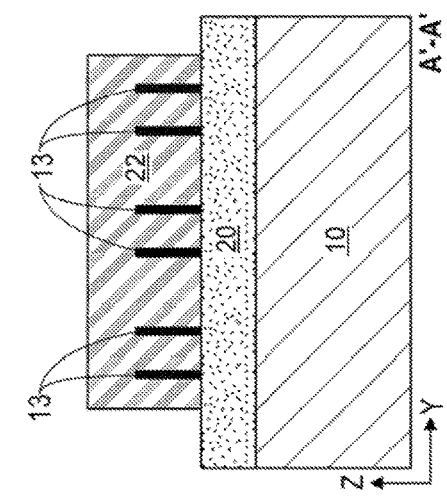
FIG. 5E is a schematic cross-sectional diagram of FIG. 5D taken along line A'-A' according to an exemplary embodiment of the present invention.

At block 130 of FIG. 1, sacrificial gate structures may be formed in the BJT and the FET regions, and at block 140 of FIG. 1, source/drain structures may be formed on exposed sidewalls of the fins 13 in the FET region by using epitaxy and/or ion implant. Referring to FIGS. 5A-5E, FIG. 5A is a schematic top-view diagram representing sacrificial gate structures 22 crossing the mandrels 11 formed in the BJT region, FIG. 5B is a schematic cross-sectional diagram of FIG. 5A taken along line A-A, FIG. 5C is a schematic cross-sectional diagram of FIG. 5A taken along line B-B, FIG. 5D is a schematic top-view diagram representing the sacrificial gate structures 22 formed crossing the fins 13 and source/drain structures 14 formed on exposed sidewalls of the fins 13 in the FET region, and FIG. 5E is a schematic cross-sectional diagram of FIG. 5D taken along line A'-A' according to an exemplary embodiment of the present invention. The sacrificial gate structures 22 are extending in parallel in the second direction (Y direction) and spaced apart in the first direction (X direction) crossing the mandrels 11 in the BJT region, and crossing the fins 13 in the FET region. The sacrificial gate structures 22 may include a sacrificial gate material including, but not limited to, a dielectric material and/or a metal. If a dielectric material is used as the sacrificial gate material, the dielectric material of the sacrificial gate structures 22 and the dielectric material of the insulating layer 20 need to have etch selectivity with each other. The sacrificial gate structures 22 may include, for example, amorphous carbon (a-C), a porous oxide, a metal oxide, a metal nitride, aluminum (Al), tungsten (W) or copper (Cu). The sacrificial gate structures 22 may be formed by first depositing a sacrificial gate material layer with a deposition process such as, for example, CVD or PECVD. After depositing the sacrificial gate material layer, the sacrificial gate material layer may then be patterned to form the sacrificial gate structures 22. The patterning process used to form the sacrificial gate structures may be similar to the photolithographic and etching processes described above in forming the first hard mask patterns 21a.

The source/drain structures 14 may be formed on exposed tops and sidewalls of the fins 13 between the sacrificial gate structures 22 in the FET region by, for example, epitaxially growing silicon and/or implant on the top surfaces and sidewall surfaces of the fins. For NMOS FinFETs (i.e. FinFETs with the source/drain structures 14 including N-type dopants), the source/drain structures 14 may be made of, for example, silicon or silicon carbide including dopants of antimony (Sb), arsenic (As) or phosphorous (P). For PMOS FinFETs (i.e. FinFETs with source/drain structures 14 including P-type dopants), the source/drain structures 14 may be made of, for example, silicon or silicon germanium including dopants of boron (B), aluminum (Al), gallium (Ga) or indium (In). The doping concentration of these N-type dopants or P-type dopants may be in a range from about $1 \times 10^{20}$ to about $8 \times 10^{20}/cm^3$, although lesser and greater concentration may also be employed. Various epitaxial growth process may be used to form the source/drain structures 14, and may include, for example, rapid thermal chemical vapor deposition (RTCVD), low energy plasma deposition (LEPD), metal organic chemical vapor deposition (MOCVD), ultra-high vacuum chemical vapor deposition (UF1VCVD), atmospheric pressure chemical vapor deposition (APCVD) and molecular beam epitaxy (MBE). The temperature for epitaxial deposition typically ranges from about 550° C. to about 900° C. Thermal cycle may optionally be applied for better diffusion. Any two of the source/drain structures 14 formed on opposite sides of each of the sacrificial gate structures 22 in the FET region, one may function as a source and the other one may function as a drain in the final FET device.

Figure 6D:
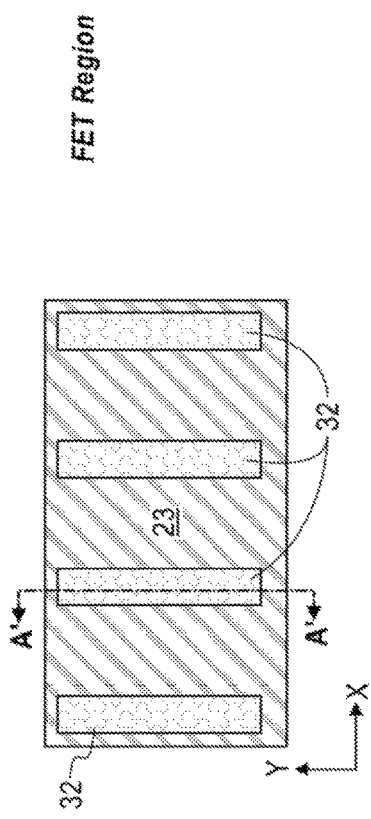
FIG. 6D is a schematic top-view diagram representing the ILD material formed to cover the sacrificial gate structures and the source/drain structures, then functional gate structures formed to replace the sacrificial gate structures in the FET region.
Figure 6E:
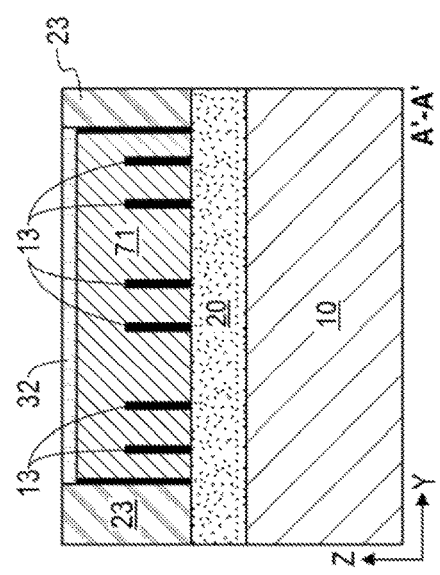
FIG. 6E is a schematic cross-sectional diagram of FIG. 6D taken along line A'-A' according to an exemplary embodiment of the present invention.

At block 150 of FIG. 1, an interlayer dielectric (ILD) material may be formed to cover the sacrificial gate structures 22 and the source/drain structures 14 in the BJT and FET regions, and at block 160 of FIG. 1, functional gate structures may be formed to replace the sacrificial gate structures 22 in the FET region. Referring to FIGS. 6A-6E, FIG. 6A is a schematic top-view diagram representing the ILD material 23 formed to cover the sacrificial gate structures 22 in the BJT region, FIG. 6B is a schematic cross-sectional diagram of FIG. 6A taken along line A-A, FIG. 6C is a schematic cross-sectional diagram of FIG. 6A taken along line B-B, FIG. 6D is a schematic top-view diagram representing the ILD material 23 formed to cover the sacrificial gate structures 22 and the source/drain structures 14, then functional gate structures 71 formed to replace the sacrificial gate structures 22 in the FET region, and FIG. 6E is a schematic cross-sectional diagram of FIG. 6D taken along line A'-A' according to an exemplary embodiment of the present invention. After the ILD material 23 is formed to cover the sacrificial gate structures 22 in the BJT region and to cover the sacrificial gate structures 22 and the source/drain structures 14 in the FET region, the ILD material 23 is then planarized. The ILD) material 23 may include a dielectric material the same as that of the insulating layer 20. The ILD material may be formed by a deposition process including, for example, CVD, PECVD, evaporation or spin coating. In the FET region, ILD material 23 is recessed to access the sacrificial gate structures 22, then the sacrificial gate structures 22 in the FET region are removed to form cavities.

In an exemplary embodiment of the present invention, the formation of the functional gate structures 71 in the FET region may include the following steps: removing the ILD material 23 above the sacrificial gate structures 22 in the FET region; removing the sacrificial gate structures 22 in the FET region to form cavities; and depositing the functional gate structures 71 in the cavities. The sequence of the steps as described above is preferred. However, the present invention is not limited to the performance of these steps with the sequence or order presented above. Many steps may also be applied to the substrate 10 before, between or after the steps shown above. Real FET gate dielectric and gate metal may be deposited in the cavities and planarized, optionally forming a cap on top of the gate metal, thus, the functional gate structures 71 may be formed with gate capping layers 32. The gate capping layers 32 may include, for example, silicon dioxide ($SiO_2$), silicon nitride ($Si_3N_4$) and/or silicon oxynitride (SiON). The real FET gate dielectric may include, for example, an oxide, a nitride, an oxynitride, or a high-k dielectric material having a dielectric constant greater than silicon dioxide. The gate metal for the functional gate structures 71 may include metal or metal nitride, and may be formed by any suitable deposition process including, but not limited to CVD, PECVD, high density CVD (HDCVD), PVD, plating, sputtering, evaporation, and spin coating. The gate metal for the functional gate structures 71 may include N-type work function metal such as, for example, titanium (Ti), aluminum (Al), titanium aluminide (TiAl), titanium aluminum nitride (TiAlN), tantalum carbide (TaC), niobium (Nb) or other suitable materials for NMOS FinFET, and may include P-type work function metal such as, for example, titanium nitride (TiN), tungsten nitride (WN), tantalum nitride (TaN) and ruthenium (Ru) or other suitable materials for PMOS FinFET. After the replacement of the sacrificial gate structures 22 with functional gate structures 71, reliability annealing may be performed. After the functional gate structures 71 is formed in the FET region, the FET region is masked for the subsequent process steps, which are carried out in the BJT region for fabricating BJT structures.

As described above, annealing steps and high temperature processes may be used in fabricating the FET, and thus any III-V semiconductor structures formed before replacing the sacrificial gate structures 22 with the functional gate structures 71 step (i.e. RMG step) may incur damage due to the high temperature process steps used in fabricating the silicon device. After RMG step, III-V semiconductor materials may be formed in the BJT region to fabricate the BiCMOS structure. That is, with the process steps illustrated in the present invention, III-V semiconductors may be grown from a sidewall of a semiconductor mandrel structure without being subjected to the high processing temperatures typically used in forming the silicon devices.

At block 170 of FIG. 1, first III-V semiconductor patterns may be formed on the sidewalls of the mandrels 11 to replace the first spacers 31 in the BJT region. The formation of the first III-V semiconductor patterns 41 is illustrated in FIGS. 7A-7D, 8A-8D and 9A-9D. In an exemplary embodiment of the present invention, the formation of the first III-V semiconductor patterns 41 may include the following steps: recessing the ILD material 23 between the sacrificial gate structures 22 in the BJT region; isotropically etching away the first spacers 31 from the sidewalls of the mandrels 11 in the BJT region; and growing the first III-V semiconductor patterns 41 on the sidewalls of the mandrels 11 in the BJT region. The sequence of the steps as described above is preferred. However, the present invention is not limited to the performance of these steps with the sequence or order presented above. Many steps may also be applied to the substrate before, between or after the steps shown above. In an exemplary embodiment of the present invention, the forming of the first III-V semiconductor patterns in the BJT region is performed after the forming of the functional gate structures in the FET region.

Figure 7A:
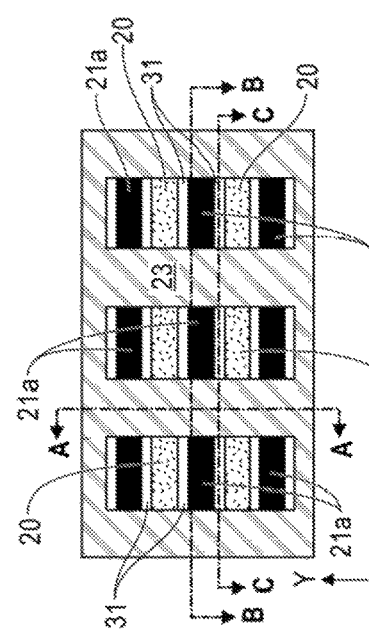
FIG. 7A is a schematic top-view diagram representing the ILD material in collector/emitter areas between the sacrificial gate structures recessed in the BJT region.
Figure 7B:
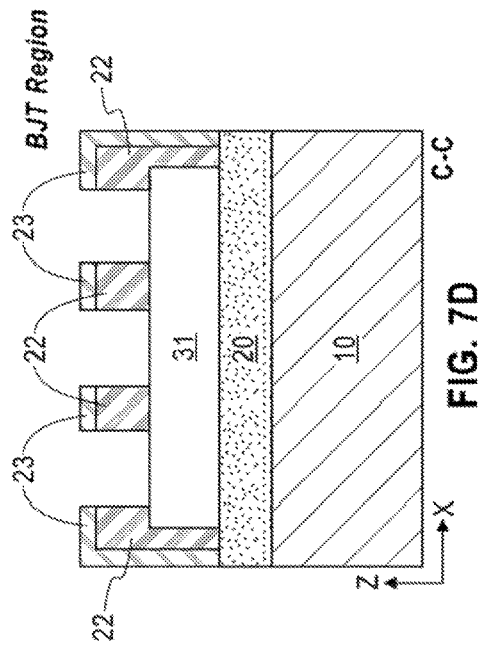
FIG. 7B is a schematic cross-sectional diagram of FIG. 7A taken along line A-A.
Figure 7C:
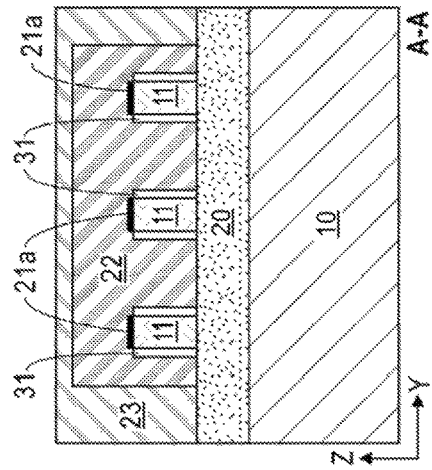
FIG. 7C is a schematic cross-sectional diagram of FIG. 7A taken along line B-B.
Figure 7D:
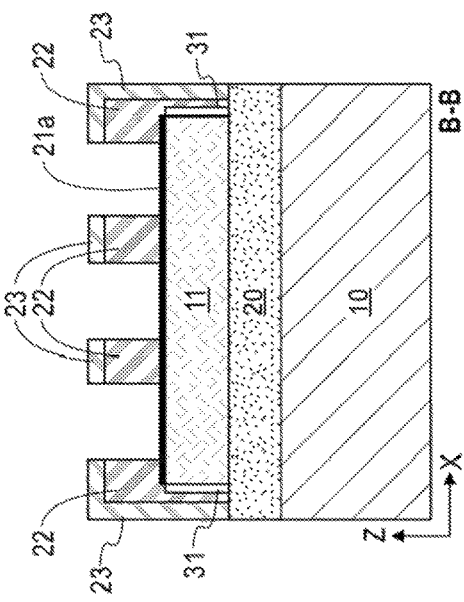
FIG. 7D is a schematic cross-sectional diagram of FIG. 7A taken along line C-C according to an exemplary embodiment of the present invention.

Referring to FIGS. 7A-7D, FIG. 7A is a schematic top-view diagram representing the ILD material 23 in collector/emitter areas between the sacrificial gate structures 22 recessed in the BJT region, FIG. 7B is a schematic cross-sectional diagram of FIG. 7A taken along line A-A, FIG. 7C is a schematic cross-sectional diagram of FIG. 7A taken along line B-B, and FIG. 7D is a schematic cross-sectional diagram of FIG. 7A taken along line C-C according to an exemplary embodiment of the present invention. To recess the ILD material 23 between the sacrificial gate structures 22 only, a selective etch that etch the ILD material 23 selective to the sacrificial gate structures 22 may be employed.

Referring to FIGS. 8A-8D, FIG. 8A is a schematic top-view diagram representing the first spacers 31 isotropically etched away in the BJT region, FIG. 8B is a schematic cross-sectional diagram of FIG. 8A taken along line A-A, FIG. 8C is a schematic cross-sectional diagram of FIG. 8A taken along line B-B, and FIG. 8D is a schematic cross-sectional diagram of FIG. 8A taken along line C-C according to an exemplary embodiment of the present invention. When the first spacers 31 include silicon nitride, the isotropicetching process may require high etch selectivity of silicon nitride over silicon oxide and silicon. Many etchants may be used to etch the first spacers 31. For example, a dry etch with $NF_3$ and $O_2$ etchants may be used to remove silicon nitride of the first spacers 31 selective to silicon oxide of the ILD material 23 and silicon of the mandrels 11. After removing the first spacers 31 from sidewalls of the mandrels 11, empty spaces 91 may be formed surrounding the mandrels 11.

Referring to FIGS. 9A-9D, FIG. 9A is a schematic top-view diagram representing the first III-V semiconductor patterns 41 formed on the sidewalls of the mandrels 11 in the BJT region, FIG. 9B is a schematic cross-sectional diagram of FIG. 9A taken along line A-A, FIG. 9C is a schematic cross-sectional diagram of FIG. 9A taken along line B-B, and FIG. 9D is a schematic cross-sectional diagram of FIG. 9A taken along line C-C according to an exemplary embodiment of the present invention. Various methods may be used to form the first III-V semiconductor patterns 41 on the sidewalls of the mandrels 11. For example, the first III-V semiconductor patterns 41 may be laterally grown on the sidewalls of the mandrels 11. The mandrels 11 may include a single crystal silicon. Although the sidewall of the mandrels 11 may have many crystallographic orientations of Si, it is preferable that the sidewalls of the mandrels 11 are Si (111) crystal plane. It is preferable that the III-V semiconductors are laterally, selectively, and epitaxially grown on Si (111) crystal plane sidewalls of the mandrels 11. The first III-V semiconductor patterns 41 may be laterally grown on and from sidewalls of the mandrels 11 to fill the empty spaces 91, and may include a III-V semiconductor which includes at least one of group III elements of boron (B), gallium (Ga), aluminum (Al) and indium (In), and at least one of group V elements of nitrogen (N), phosphorus (P), arsenic (As), antimony (Sb) and bismuth (Bi). For example, the II-V semiconductor may be a binary, ternary, or quaternary alloy including at least one of group III elements and at least one of group V elements. The binary alloy may be, for example, one of GaAs, GAN, GaP, InP, InAs, InSb, and GaSb. The ternary alloy may be, for example, one of AlGaAs, InGaAs, InGaP, InGaSb, GaAsSb, AlInAs, AlInSb, AlGaP, InAsSb, GaAsP, InGaN, and AlGaN. The quaternary alloy may be, for example one of InGaAlP, AlGaAsSb, AlGaPSb, InGaAlSb, and AlGaPAs. The first III-V semiconductor patterns 41 may include an undoped III-V semiconductor. However, the present invention is not limited thereto. For example, the first III-V semiconductor patterns 41 may include P-type dopants. The P-type dopants may be introduced into the first III-V semiconductor patterns 41 during the III-V semiconductor laterally growing process or introduced after utilizing one of ion implantation or gas phase doping. The amount of P-type dopants that may be present in the first III-V semiconductor patterns 41 may be in a range from about $1\times10^{18}$ to about $1\times10^{21}/cm^3$, although lesser and greater concentration may also be employed. Alternatively, the first III-V semiconductor patterns 41 may include N-type dopants. The P-type dopant for III-V semiconductor may be, for example, zinc (Zn), beryllium (Be), cadmium (Cd) or magnesium (Mg). The N-type dopant for III-V semiconductor may be, for example, silicon (Si), tin (Sn), sulfur (S), or selenium (Se). A BJT may be manufactured as either NPN type or PNP type. An NPN BJT includes two regions of N-type semiconductor material constituting the emitter and collector regions, and a region of P-type semiconductor material located between the two regions of N-type semiconductor material constituting the base region. In this case, each of the first III-V semiconductor patterns 41 may be formed as the base of the NPN BJT, and may be P-doped. On the other hand, each of the first III-V semiconductor patterns 41 may be formed as the base of a PNP BJT, and may be N-doped. Since the first III-V semiconductor patterns 41 are formed to replace the first spacers 31, they may have similar shape as that of the fins 13 and may be formed as fin-type bases for the BJT.

At block 180 of FIG. 1, second III-V semiconductor patterns may be formed on sidewalls and tops of the first III-V semiconductor patterns 41 between the sacrificial gate structures 22 in the BJT region. The formation of the second III-V semiconductor patterns 42 is illustrated in FIGS. 10A-10I), 11A-11D) and 12A-12D. In an exemplary embodiment of the present invention, the formation of the second III-V semiconductor patterns 42 may include the following steps: performing mandrel pull between the sacrificial gate structures 22 in collector/emitter area in the BJT region; and epitaxially growing the second III-V semiconductor patterns 42 on the sidewalls and the tops of the first III-V semiconductor patterns 41 between the sacrificial gate structures 22 in the collector/emitter area in the BJT region. The sequence of the steps as described above is preferred. However, the present invention is not limited to the performance of these steps with the sequence or order presented above. Many steps may also be applied to the substrate before, between or after the steps shown above. In an exemplary embodiment of the present invention, the formation of the second III-V semiconductor patterns 42 may include forming second spacers 33 on exposed sidewalls of the sacrificial gate structures 22 and exposed sidewalls of the mandrels 11, after performing mandrel pull between the sacrificial gate structures 22 in collector/emitter area in the BJT region.

Figure 10A:
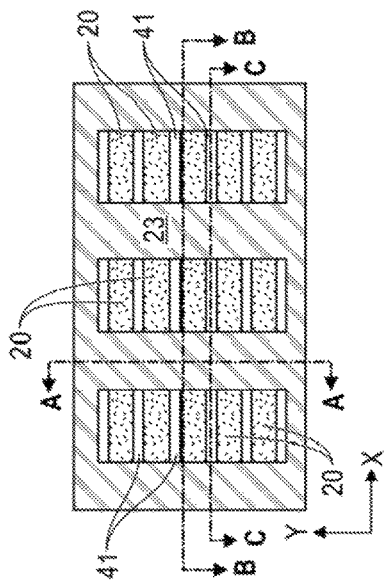
FIG. 10A is a schematic top-view diagram representing the mandrels pulled between the sacrificial gate structures in the collector/emitter areas in the BJT region.
Figure 10B:
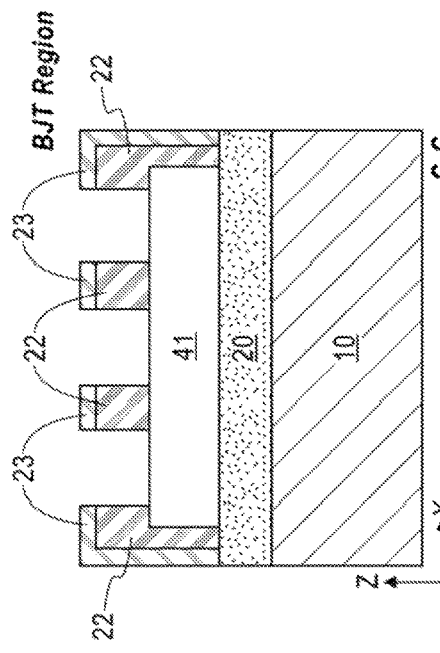
FIG. 10B is a schematic cross-sectional diagram of FIG. 10A taken along line A-A.
Figure 10C:
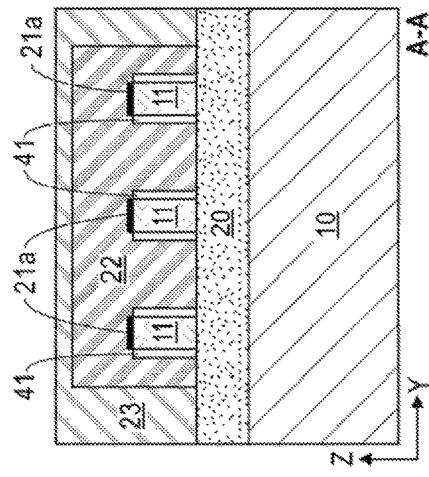
FIG. 10C is a schematic cross-sectional diagram of FIG. 10A taken along line B-B.
Figure 10D:
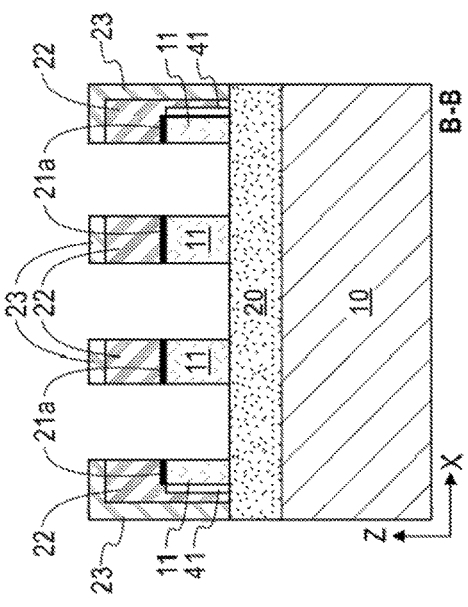
FIG. 10D is a schematic cross-sectional diagram of FIG. 10A taken along line C-C according to an exemplary embodiment of the present invention.

Referring to FIGS. 10A-10D, FIG. 10A is a schematic top-view diagram representing the mandrels 11 pulled between the sacrificial gate structures 22 in the collector/emitter areas in the BJT region, FIG. 101B is a schematic cross-sectional diagram of FIG. 10A taken along line A-A, FIG. 10C is a schematic cross-sectional diagram of FIG. 10A taken along line B-B, and FIG. 10D is a schematic cross-sectional diagram of FIG. 10A taken along line C-C according to an exemplary embodiment of the present invention. The etch process used for pulling the mandrels 11 between the sacrificial gate structures 22 in the collector/emitter areas in the BJT region may be any conventional RIE processes using different etchants to etch the first hard mask patterns 21a and the mandrels 11. When the first hard mask patterns 21a include silicon oxide, and the mandrels include silicon. The breakthrough etch to remove the first hard mask patterns 21a may use etchants containing fluorine, such as: $CF_4$, and/or $CF_2/CH_2F_2$. The silicon etch process for the mandrels 11 may use etchants such as: $Cl_2/HBr/CF_4/O_2$, and/or $HBr/O_2$.

Figure 11A:
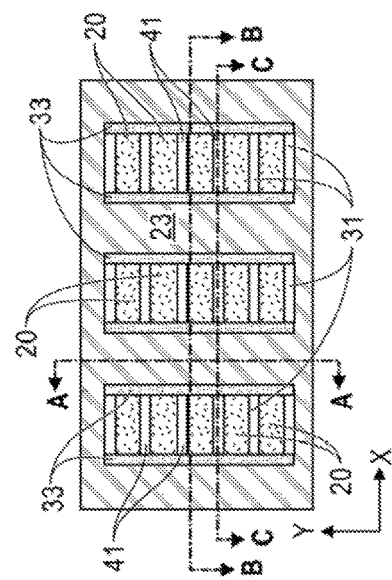
FIG. 11A is a schematic top-view diagram representing second spacers formed on exposed sidewalls of the mandrels, the first hard mask patterns, the sacrificial gate structures and the ILD material in the BJT region.
Figure 11B:
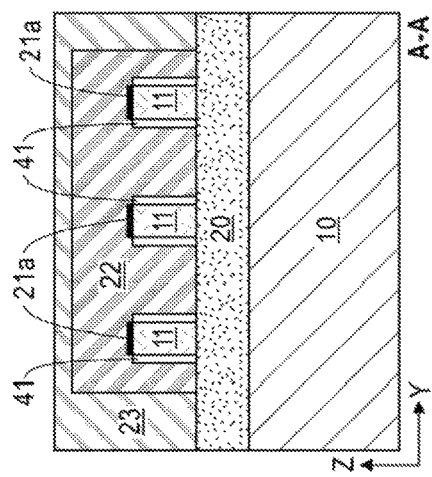
FIG. 11B is a schematic cross-sectional diagram of FIG. 11A taken along line A-A.
Figure 11D:
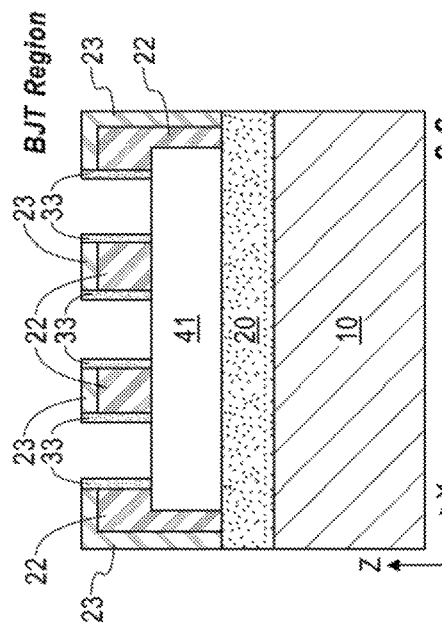
FIG. 11D is a schematic cross-sectional diagram of FIG. 11A taken along line C-C according to an exemplary embodiment of the present invention.
Figure 11C:
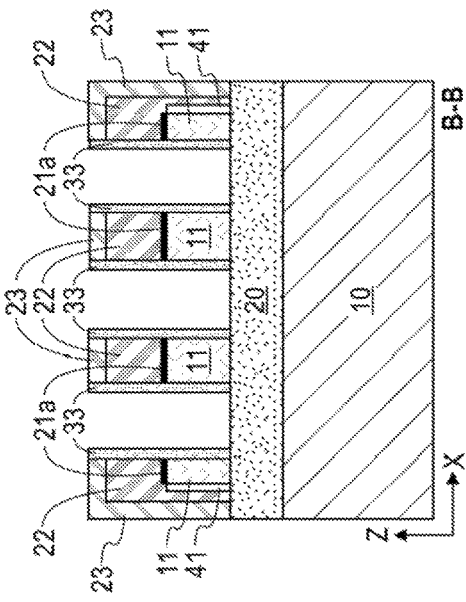
FIG. 11C is a schematic cross-sectional diagram of FIG. 11A taken along line B-B.

Referring to FIGS. 11A-11D, FIG. 1A is a schematic top-view diagram representing the second spacers 33 formed on exposed sidewalls of the mandrels 11, the first hard mask patterns 21a, the sacrificial gate structures 22 and the ILD material 23 in the BJT region, FIG. 11B is a schematic cross-sectional diagram of FIG. 11A taken along line A-A, FIG. 11C is a schematic cross-sectional diagram of FIG. 11A taken along line B-B, and FIG. 11D is a schematic cross-sectional diagram of FIG. 11A taken along line C-C according to an exemplary embodiment of the present invention. The process of forming the second spacers 33 may be the same as the process used in forming the first spacers 31 described above. The second spacers 33 may be used to separate second III-V semiconductor patterns from base contacts. Both the second III-V semiconductor patterns and the base contacts are to be formed in the subsequent process steps. The second spacers 33 may include silicon oxide ($SiO_2$), silicon nitride ($Si_3N_4$), boron nitride (BN), amorphous carbon (a-C), metal, and/or metal oxide, and may have a thickness ranging from about 4 nm to about 20 nm and should be proportional to the size of the feature intended to be patterned. Preferably, the material for the second spacers 33 is silicon nitride. Various methods may be used to deposit the material of the second spacers 33. ALD method is suitable for making smooth, conformal layers, and may be chosen to deposit the material of the second spacers 33.

Referring to FIGS. 12A-12D, FIG. 12A is a schematic top-view diagram representing the second III-V semiconductor patterns 42 formed on sidewalls and tops of the first III-V semiconductor patterns 41 between the sacrificial gate structures 22 in the collector/emitter areas in the BJT region, FIG. 12B is a schematic cross-sectional diagram of FIG. 12A taken along line A-A, FIG. 12C is a schematic cross-sectional diagram of FIG. 12A taken along line B-B, and FIG. 12D is a schematic cross-sectional diagram of FIG. 12A taken along line C-C according to an exemplary embodiment of the present invention. The second III-V semiconductor patterns 42 may be grown on and from the tops and the sidewalls of the first III-V semiconductor patterns 41, and may include a III-V semiconductor which includes at least one of group III elements of boron (B), gallium (Ga), aluminum (Al) and indium (In), and at least one of group V elements of nitrogen (N), phosphorus (P), arsenic (As), antimony (Sb) and bismuth (Bi). The second III-V semiconductor patterns 42 and the first III-V semiconductor patterns 41 may include the same III-V semiconductor or different III-V semiconductors. For example, the second III-V semiconductor patterns 42 and the first III-V semiconductor patterns 41 may both include InGaAs to form a homogeneous junction, or one may include InGaAs and the other one may include GaAs for forming a heterojunction. Although the second III-V semiconductor patterns 42 and the first III-V semiconductor patterns 41 may both include InGaAs, a heterojunction may still be formed by incorporating different percentages of Indium in the InGaAs included in the second III-V semiconductor patterns 42 and the first III-V semiconductor patterns 41. For the NPN BJT, the second III-V semiconductor patterns 42 may be N-doped. They may be heavily doped, for example, the second III-V semiconductor patterns 42 may include an InGaAs n+ or GaAs n+. On the other hand, for the PNP BJT, the second III-V semiconductor patterns 42 may be P-doped. They may be heavily doped, for example, the second III-V semiconductor patterns 42 may include an InGaAs p+ or GaAs p+. The second III-V semiconductor patterns 42 may be formed by an epitaxial growth process. If the dopant is included in the growth process, the dopant of the second III-V semiconductor patterns 42 may diffuse into the first III-V semiconductor patterns 41 in the collector/emitter areas in the BJT region, rendering the materials of the second III-V semiconductor patterns 42 and the first III-V semiconductor patterns 41 indistinguishable in the collector/emitter areas. Similarly, if ion implantation of the dopant is carried out afterwards, the doping may occur on both the second III-V semiconductor patterns 42 and the first III-V semiconductor patterns 41 in the collector/emitter areas and make them indistinguishable. Each of the second III-V semiconductor patterns 42 may serve as one of a collector and an emitter for the BJT.

At block 190 of FIG. 1, base contacts may be formed to replace the sacrificial gate structures 22 in the BJT region. The formation of the base contacts 72 is illustrated in FIGS. 13A-13D, 14A-14D, 15A-15D and 16A-16D. In an exemplary embodiment of the present invention, the formation of the base contacts 72 in the BJT region may include the following steps: depositing the ILD) material 23 over the substrate 10 to fill all spaces among the mandrels 11, the sacrificial gate structures 22, and the first and second III-V semiconductor patterns 41 and 42; planarizing top surface of the ILD material 23; recessing the top surface of the ILD material 23 to access the sacrificial gate structure 22 in the BJT region; removing the sacrificial gate structures 22 in the BJT region; performing mandrel pull to remove all remaining mandrels 11 in the BJT region; and depositing base contacts 72 to fill spaces after mandrel pull, and planarizing top surfaces of the base contacts 72. The sequence of the steps as described above is preferred. However, the present invention is not limited to the performance of these steps with the sequence or order presented above. Many steps may also be applied to the substrate before, between or after the steps shown above.

Figure 13A:
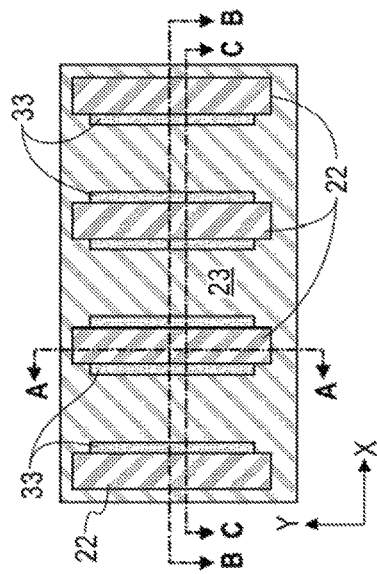
FIG. 13A is a schematic top-view diagram representing ILD material deposited, planarized and recessed to expose top surfaces of the sacrificial gate structures in the BJT region.
Figure 13B:
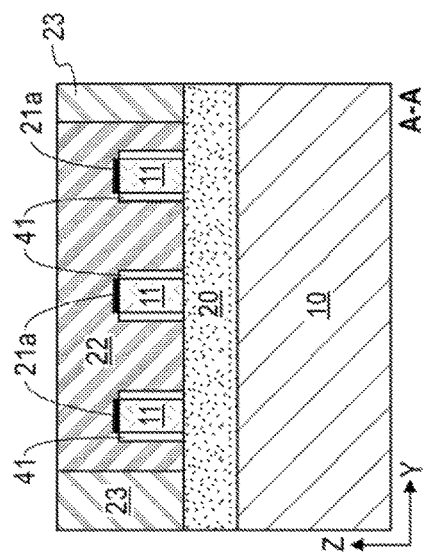
FIG. 13B is a schematic cross-sectional diagram of FIG. 13A taken along line A-A.
Figure 13D:
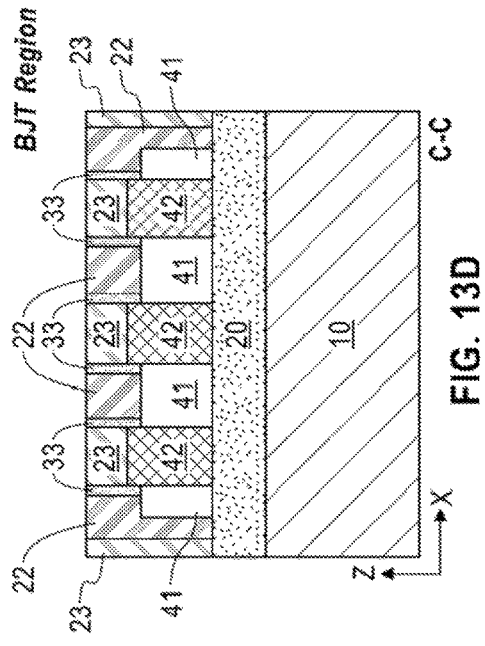
FIG. 13D is a schematic cross-sectional diagram of FIG. 13A taken along line C-C according to an exemplary embodiment of the present invention.
Figure 13C:
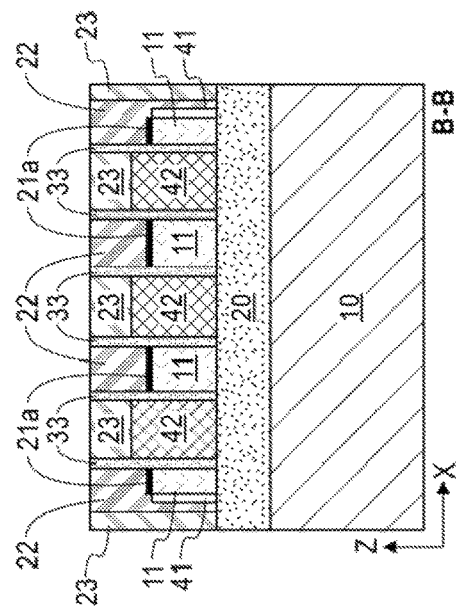
FIG. 13C is a schematic cross-sectional diagram of FIG. 13A taken along line B-B.

Referring to FIGS. 13A-13D, FIG. 13A is a schematic top-view diagram representing the ILD material 23 deposited, planarized and recessed to expose top surfaces of the sacrificial gate structures 22 in the BJT region, FIG. 13B is a schematic cross-sectional diagram of FIG. 13A taken along line A-A, FIG. 13C is a schematic cross-sectional diagram of FIG. 13A taken along line B-B, and FIG. 13D is a schematic cross-sectional diagram of FIG. 13A taken along line C-C according to an exemplary embodiment of the present invention. Similar to the process used in forming the functional gate structures 71 in the FET region, the ILD material 23 may be deposited with, for example, CVD, PECVD, evaporation or spin coating to fill the spaces between the sacrificial gate structures 22 in the collector/emitter area and planarized. In the BJT region, ILD material 23 is removed to access the sacrificial gate structures 22. That is, the ILD material 23 is removed until the top surfaces of the sacrificial gate structures 22 are exposed. The process of removing ILD material may be an etching process or may be the planarization process such as, for example, chemical mechanical polishing (CMP) process.

Figure 14A:
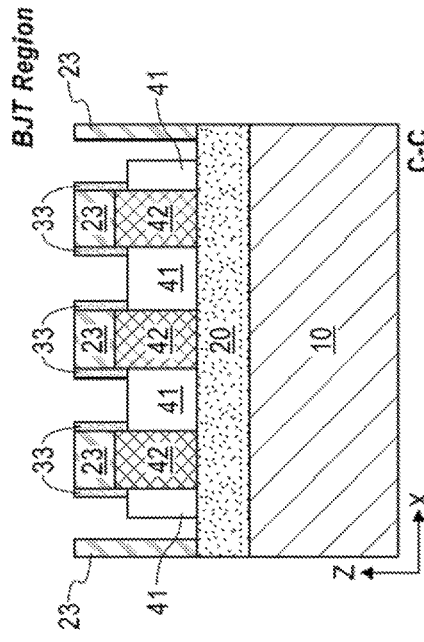
FIG. 14A is a schematic top-view diagram representing the sacrificial gate structures removed in the BJT region.
Figure 14D:
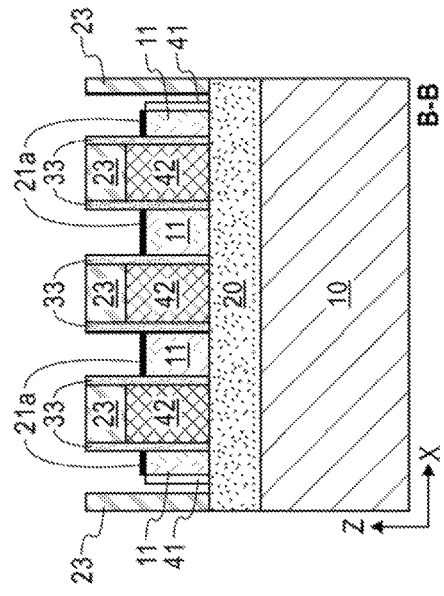
FIG. 14D is a schematic cross-sectional diagram of FIG. 14A taken along line C-C according to an exemplary embodiment of the present invention.
Figure 14B:
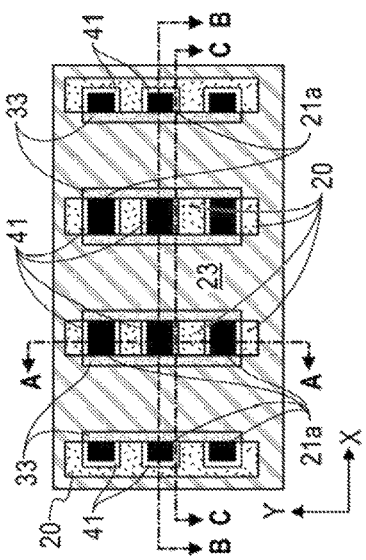
FIG. 14B is a schematic cross-sectional diagram of FIG. 14A taken along line A-A.
Figure 14C:
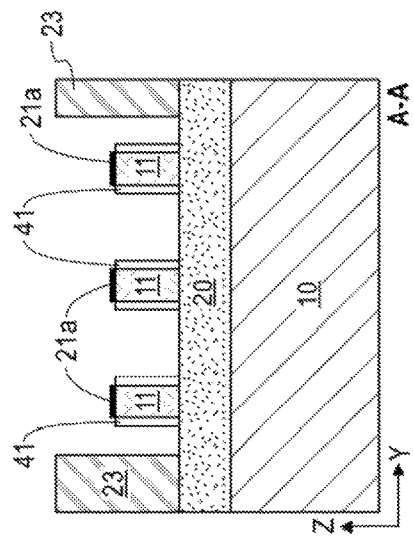
FIG. 14C is a schematic cross-sectional diagram of FIG. 14A taken along line B-B.

Referring to FIGS. 14A-14D, FIG. 14A is a schematic top-view diagram representing the sacrificial gate structures 22 removed in the BJT region, FIG. 14B is a schematic cross-sectional diagram of FIG. 14A taken along line A-A, FIG. 14C is a schematic cross-sectional diagram of FIG. 14A taken along line B-B, and FIG. 14D is a schematic cross-sectional diagram of FIG. 14A taken along line C-C according to an exemplary embodiment of the present invention. The etch process employed to remove the sacrificial gate structures 22 may be selective to the ILD material 23, the insulating layer 20, the first hard mask patterns 21a, the second spacers 33, and the first III-V semiconductor patterns 41, and may also be selective to the mandrels 11 and the second III-V semiconductor patterns 42.

Figure 15A:
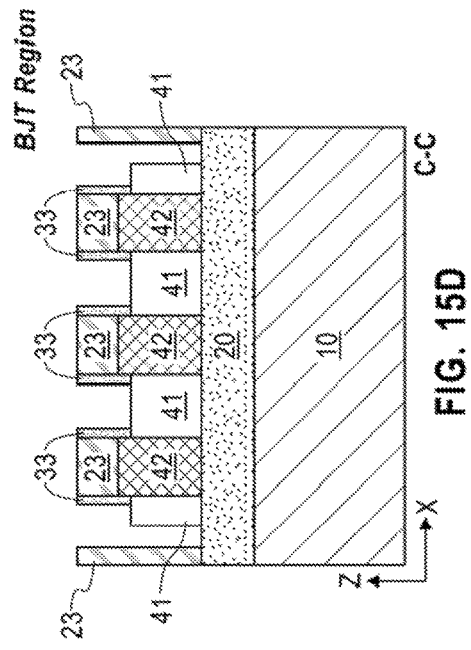
FIG. 15A is a schematic top-view diagram representing the mandrels pulled in the BJT region.
Figure 15D:
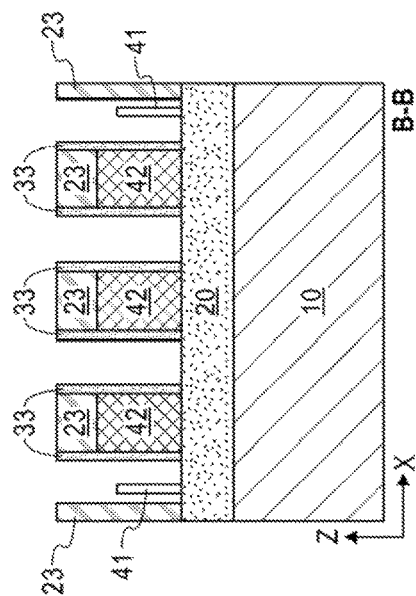
FIG. 15D is a schematic cross-sectional diagram of FIG. 15A taken along line C-C according to an exemplary embodiment of the present invention.
Figure 15B:
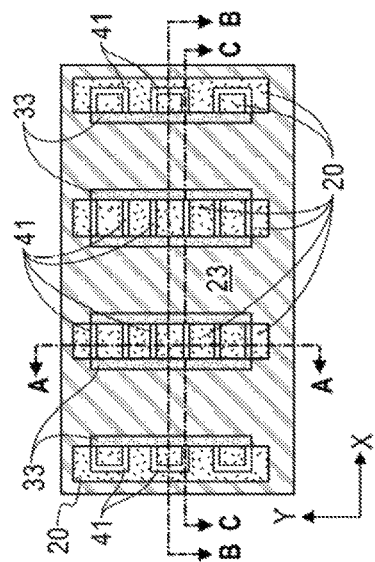
FIG. 15B is a schematic cross-sectional diagram of FIG. 15A taken along line A-A.
Figure 15C:
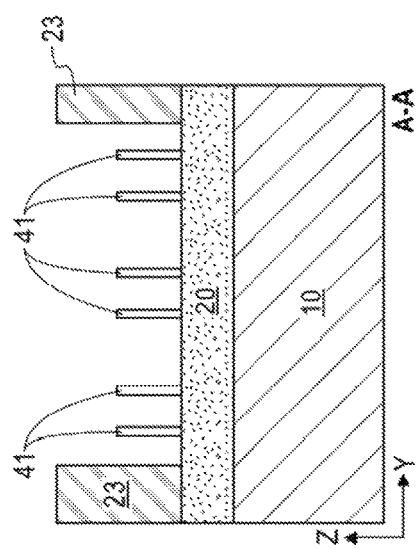
FIG. 15C is a schematic cross-sectional diagram of FIG. 15A taken along line B-B.

Referring to FIGS. 15A-15D, FIG. 15A is a schematic top-view diagram representing the mandrels 11 pulled in the BJT region, FIG. 15B is a schematic cross-sectional diagram of FIG. 15A taken along line A-A, FIG. 15C is a schematic cross-sectional diagram of FIG. 15A taken along line B-B, and FIG. 15D is a schematic cross-sectional diagram of FIG. 15A taken along line C-C according to an exemplary embodiment of the present invention. The etch process employed to pull all the remaining mandrels 11 may be selective to the first III-V semiconductor patterns 41 and the second III-V semiconductor patterns 42. When the first hard mask patterns 21a include silicon oxide, and the mandrels include silicon. The breakthrough etch to remove the first hard mask patterns 21a may use etchants containing fluorine, such as: $CF_4$, and/or $CF_2/CH_2F_2$. The silicon etch process for the mandrels 11 may use etchants such as: $Cl_2/HBr/CF_4/O_2$, and/or $HBr/O_2$.

Figure 16A:
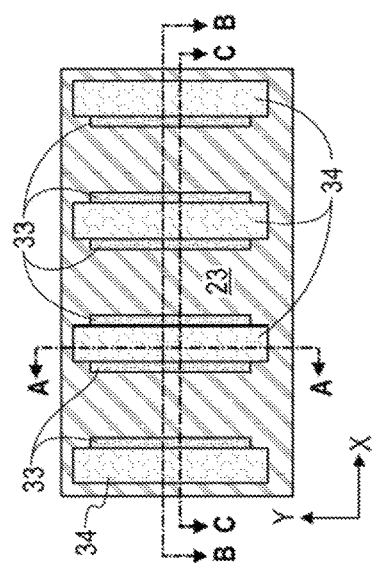
FIG. 16A is a schematic top-view diagram representing base contacts formed in the BJT region.
Figure 16B:
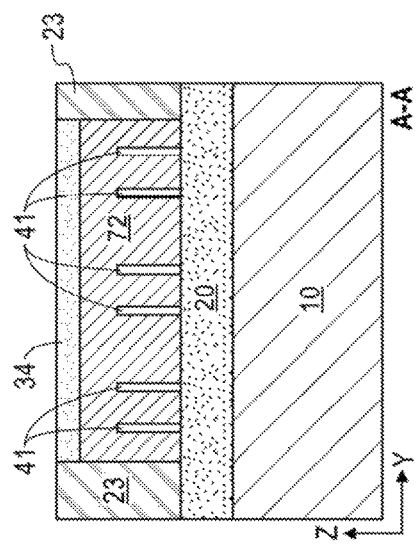
FIG. 16B is a schematic cross-sectional diagram of FIG. 16A taken along line A-A.
Figure 16C:
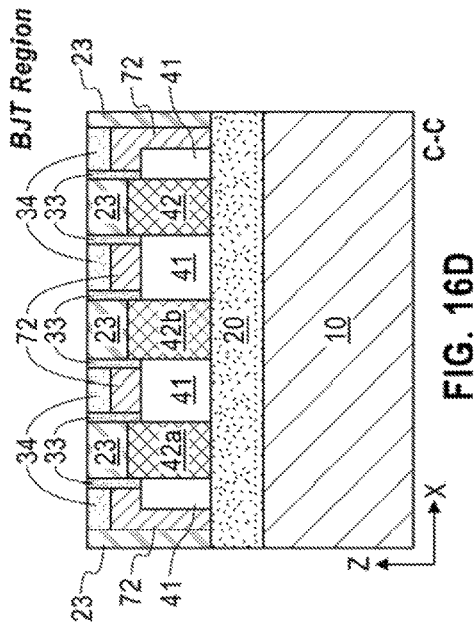
FIG. 16C is a schematic cross-sectional diagram of FIG. 16A taken along line B-B.
Figure 16D:
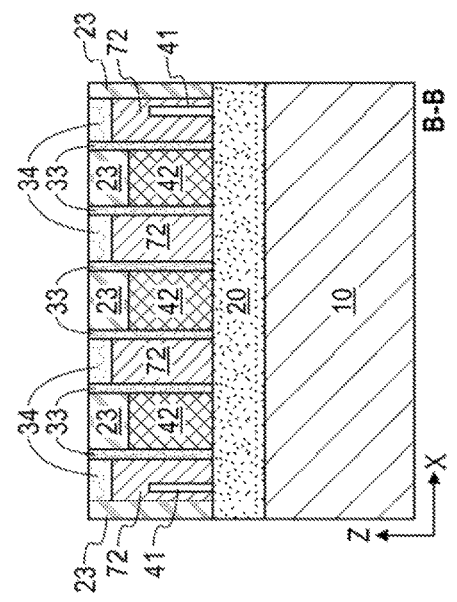
FIG. 16D is a schematic cross-sectional diagram of FIG. 16A taken along line C-C.

Referring to FIGS. 16A-16D, FIG. 16A is a schematic top-view diagram representing the base contacts 72 formed in the BJT region, FIG. 16B is a schematic cross-sectional diagram of FIG. 16A taken along line A-A, FIG. 16C is a schematic cross-sectional diagram of FIG. 16A taken along line B-B, and FIG. 16D is a schematic cross-sectional diagram of FIG. 16A taken along line C-C according to an exemplary embodiment of the present invention. After performing pulling the mandrels 11, the base contacts 72 may be deposited to fill the spaces formed after removing the sacrificial gate structures 22 and the mandrels 11, and the top surfaces of the base contacts 72 may be planarized. Thus, the base contacts 72 may be formed to replace the sacrificial gate structures 22 and the mandrels 11 covered by the sacrificial gate structures 22. A conductive material may be formed as the base contacts 72 to fill the spaces with various deposition processes include, but are not limited to: PVD, CVD, ALD, electrochemical deposition (ECD), electroplating, electroless plating and spin coating. The base contacts 72 may include, for example, silicon (Si), germanium (Ge), InGaAs p+, or the like. The base contacts 72 may also include two or more different materials such as InGaAs p+ on the bottom and metal such as tungsten (W), aluminum (Al), or titanium (Ti) on the top. In an exemplary embodiment of the present invention, caps may be formed on top of the base contacts 72, thus, the base contacts 72 may be formed with base contact capping layers 34. The base contact capping layers 34 may include, for example, silicon dioxide ($SiO_2$), silicon nitride ($Si_3N_4$) and/or silicon oxynitride (SiON). As shown in FIG. 16D, the second III-V semiconductor patterns 42 may include a collector 42a and an emitter 42b positioned on the opposite sides of the base contact 72. In an exemplary embodiment of the present invention, the second III-V semiconductor patterns 42 may include two different III-V semiconductors on opposite sides of each base contact 72. That is, the collector 42a and the emitter 42b may include different III-V semiconductors. For example, the collector 42a may include InGaAs, and the emitter 42b may include GaAs. Forming two different III-V semiconductors on opposite sides of each base contact 72 may be done by removing the ILD material 23 and the underlying III-V semiconductor material from either the collector area or the emitter area and then regrowing a different III-V semiconductor material in the collector area or the emitter area removed.

According to an exemplary embodiment of the present invention, a method of manufacturing a semiconductor structure may include the following steps: providing a substrate 10 including a field effect transistor (FET) region and a bipolar junction transistor (BJT) region; forming a plurality of fins 13 in the FET region on the substrate 10 extending in a first direction and spaced apart in a second direction crossing the first direction, a plurality of functional gate structures 71 spaced apart in the first direction and extending in the second direction crossing the plurality of fins 13 in the FET region, a source 14 and a drain 14 formed on opposite sides of each of the plurality of functional gate structures 71 in the FET region, a plurality of mandrels 11 having first spacers 31 on sidewalls in the BJT region on the substrate 10 extending in the first direction and spaced apart in the second direction, and a plurality of sacrificial gate structures 22 spaced apart in the first direction and extending in the second direction crossing the plurality of mandrels 11 in the BJT region, and an interlayer dielectric (ILD) material 23 covering the plurality of sacrificial gate structures 22, the sources 14 and the drains 14 in the BJT and FET regions; forming a plurality of fin-type bases 41 on the sidewalls of the plurality of mandrels 11 to replace the first spacers 31 in the BJT region, while masking the FET region; forming a collector 42a and an emitter 42b on sidewalls and tops of each of the plurality of fin-type bases 41 at opposite sides of each of the plurality of sacrificial gate structures 22 in the BJT region; forming a plurality of base contacts 72 to replace the plurality of sacrificial gate structures 22 and the plurality of mandrels 11 covered by the plurality of sacrificial gate structures 22 in the BJT region, in which the plurality of fins 13 include a group IV semiconductor, and the plurality of fin-type bases 41 include a III-V semiconductor including at least one of group III elements of boron (B), gallium (Ga), aluminum (Al) and indium (In), and at least one of group V elements of nitrogen (N), phosphorus (P), arsenic (As), antimony (Sb) and bismuth (Bi). The sequence of the steps as described above is preferred. However, the present invention is not limited to the performance of these steps with the sequence or order presented above. Many steps may also be applied to the substrate before, between or after the steps shown above.

The plurality of fins 13 may include a group IV semiconductor such as, for example, silicon (Si), germanium (Ge), silicon germanium (SiGe), or silicon carbide (SiC). The preferable material for the plurality of fins 13 is Si. The plurality of fin-type bases 41 may include a III-V semiconductor, and are formed on the sidewalls of the mandrels 11 with the process steps as described above. The formed III-V semiconductor material described above may not be compatible with silicon device which usually requires high processing temperatures. As such, the present invention provides a method that the plurality of fin-type bases 41, which include a III-V semiconductor, are formed in BJT region after the RMG processing step for the FET in manufacturing the BiCMOS structure.

In an exemplary embodiment of the present invention, the formation of the collector 42a and the emitter 42b may further include forming a plurality of second spacers 33 on exposed sidewalls of the plurality of sacrificial gate structures 22 and exposed sidewalls of the plurality of mandrels 11 in the BJT region. The plurality of second spacers 33 may include, for example, silicon oxide ($SiO_2$), silicon nitride ($Si_3N_4$), boron nitride (BN), amorphous carbon (a-C), metal, and/or metal oxide, and may have a thickness ranging from about 4 nm to about 20 nm and should be proportional to the size of the feature intended to be patterned. The collector 42a and the emitter 42b may be include the same III-V semiconductor. Alternatively, the collector 42a and the emitter 42b may include different III-V semiconductors. For example, the collector 42a may include InGaAs, and the emitter 42b may include GaAs. BJT in the BiCMOS structure may be manufactured in two types, NPN and PNP. For the NPN BJT, each of the plurality of fin-type bases 41 may include a P-type III-V semiconductor, and the collector 42a and the emitter 42b may include N-type III-V semiconductors. They may be heavily doped, for example, the collector 42a may include an InGaAs n+, and the emitter 42b may include GaAs n+. On the other hand, for the PNP BJT, the collector 42a and the emitter 42b may be P-doped. They may be heavily doped, for example, the collector 42a may include an InGaAs p+ and the emitter 42b may include GaAs p+. The P-type or N-type dopants may be introduced into the collector 42a and the emitter 42b during the collector 42a and the emitter 42b laterally growing process or introduced after utilizing one of ion implantation or gas phase doping.

Figure 16E:
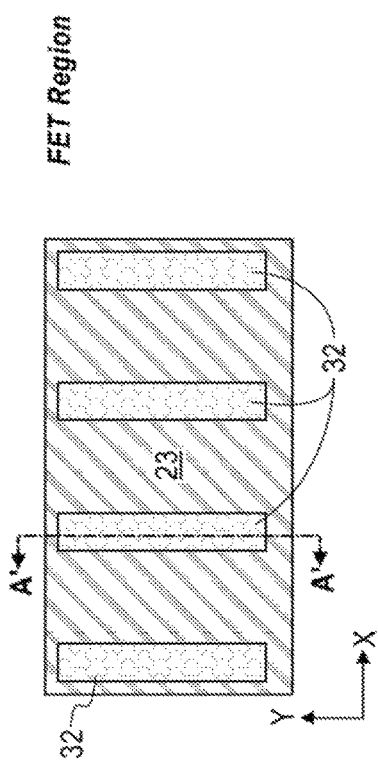
FIG. 16E is a schematic top-view diagram representing no structure change after the functional gate structures formed in the FET region.
Figure 16F:
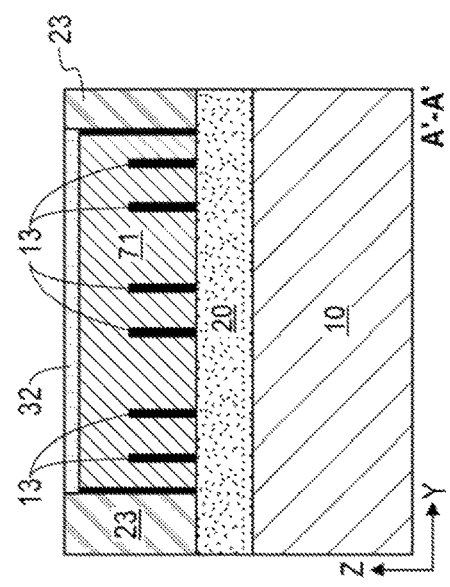
FIG. 16F is a schematic cross-sectional diagram of FIG. 16E taken along line A'-A' according to an exemplary embodiment of the present invention.

An exemplary embodiment of the present invention may include a BiCMOS structure having III-V semiconductors grown BJT after RMG as shown in FIGS. 16A-16F. FIGS. 16A-16D show the BJT structure in the BJT region, and FIGS. 16E-16F show the FinFET structure in the FET region of the semiconductor structure, for example, the BiCMOS structure. Referring to FIGS. 16A-16F, the semiconductor structure may include: a substrate 10 including an FET region and a BJT region; a plurality of fins 13 in the FET region and a plurality of fin-type bases 41 in the BJT region on the substrate 10 extending in a first direction and spaced apart in a second direction crossing the first direction; a plurality of functional gate structures 71 spaced apart in the first direction and extending in the second direction crossing the plurality of fins 13 in the FET region, and a plurality of base contacts 72 spaced apart in the first direction and extending in the second direction crossing the plurality of fin-type bases 41 in the BJT region; and a source 14 and a drain 14 formed on opposite sides of each of the plurality of functional gate structures 71 in the FET region, and a collector 42a and an emitter 42b formed on opposite sides of each of the plurality of base contacts 72 in the BJT region, in which the plurality of fins include a group IV semiconductor, and the plurality of fin-type bases include a III-V semiconductor including at least one of group III elements of boron (B), gallium (Ga), aluminum (Al) and indium (In), and at least one of group V elements of nitrogen (N), phosphorus (P), arsenic (As), antimony (Sb) and bismuth (Bi).

The substrate 10 for the semiconductor structure, for example, the BiCMOS structure, may be any suitable substrate, and may include a semiconducting material such as, for example, silicon (Si), germanium (Ge), silicon germanium (SiGe), silicon carbide (SiC), gallium nitride (GaN) or gallium arsenide (GaAs), a non-semiconducting material such as, for example, silicon oxide ($SiO_2$), aluminum (Al), aluminum oxide ($Al_2O_3$), ceramic, quartz, or copper (Cu), or any combination thereof, including multilayers, for example, germanium on silicon. The substrate 10 can include one or more semiconductor layers or structures and can include active or operable portions of semiconductor devices. For some applications, the substrate 10 may be a semiconductor substrate doped with impurities to render them P-type or N-type. In a p-doped silicon substrate, the Si substrate may be doped with P-type dopants such as, for example, boron (B), aluminum (Al), gallium (Ga) and indium (In). In an n-doped silicon substrate, the Si substrate may be doped with N-type dopants such as, for example, antimony (Sb), arsenic (As) and phosphorous (P). The preferable substrate material for the substrate 10 is silicon.

An insulating layer 20 may be formed above the substrate 10 to isolate the FinFET and the BJT with the substrate 10. The insulating layer 20 may include tetraethyl orthosilicate (TEOS), silicon nitride ($Si_3N_4$), silicon oxide ($SiO_2$), silicon oxynitride (SiON), nanoporous silica, hydrogensilsesquioxanes (HSQ), Teflon-AF (polytetrafluorethylene or PTFE), silicon oxyfluoride (FSG), carbon doped $SiO_2$ (SiCO), hydrogenated silicon oxycarbide (SiCOH), or other low k dielectric materials. The preferable material for the insulating layer 20 is $SiO_2$. The thickness of the insulating layer may be in a range from about 5 nm to about 250 nm, for example, may be in a range from about 50 nm to about 200 nm.

The plurality of fins 13 for the FinFET may be formed in the FET region on the substrate 10 extending parallelly in a first direction (X direction) and spaced apart in a second direction (Y direction) crossing the first direction (X direction). The plurality of fins 13 may include a group IV semiconductor such as, for example, silicon (Si), germanium (Ge), silicon germanium (SiGe), or silicon carbide (SiC). The preferable material for the plurality of fins 13 is Si. The plurality of fins 13 may each have a fin width in a range from about 3 nm to about 40 nm, a fin height in a range from about 5 nm to about 80 nm, and a fin pitch in a range from about 10 nm to about 100 nm.

The plurality of fin-type bases 41 for the BJT may be formed in the BJT region on the substrate 10 extending parallelly in the first direction (X direction) and spaced apart in the second direction (Y direction) crossing the first direction (X direction). The plurality of fin-type bases 41 may include a III-V semiconductor including at least one of group III elements of boron (B), gallium (Ga), aluminum (Al) and indium (In), and at least one of group V elements of nitrogen (N), phosphorus (P), arsenic (As), antimony (Sb) and bismuth (Bi). For example, the plurality of fin-type bases 41 may include InGaAs. The plurality of fin-type bases 41 may be N-doped for PNP BJT, or P-doped for NPN BJT. The N-type dopant for III-V semiconductor may be, for example, silicon (Si), tin (Sn), sulfur (S), or selenium (Se). The P-type dopant for III-V semiconductor may be, for example, zinc (Zn), beryllium (Be), cadmium (Cd) or magnesium (Mg). The plurality of fin-type bases 41 may each have a width in a range from about 3 nm to about 40 nm, a height in a range from about 5 nm to about 80 nm, and a pitch in a range from about 10 nm to about 100 nm.

The plurality of functional gate structures 71 for the FinFET may be spaced apart in the first direction (X direction) and extending parallelly in the second direction (Y direction) crossing the plurality of fins 13 in the FET region. The plurality of functional gate structures 71 may each include at least a gate dielectric and a gate metal. The gate dielectric for the functional gate structures 71 may include, for example, an oxide, a nitride, an oxynitride, or a high-k dielectric material having a dielectric constant greater than silicon dioxide. The gate metal for the functional gate structures 71 may include metal or metal nitride, and may include N-type work function metal such as, for example, titanium (Ti), aluminum (Al), titanium aluminide (TiAl), titanium aluminum nitride (TiAlN), tantalum carbide (TaC), niobium (Nb) or other suitable materials for NMOS FinFET, and may include P-type work function metal such as, for example, titanium nitride (TiN), tungsten nitride (WN), tantalum nitride (TaN) and ruthenium (Ru) or other suitable materials for PMOS FinFET. The plurality of functional gate structures 71 may each have a gate width in a range from about 10 nm to about 300 nm, a gate height in a range from about 10 nm to about 160 nm, and a gate pitch in a range from about 20 nm to about 300 nm. In an exemplary embodiment of the present invention, a gate capping layers 32 may be formed on top of each of the plurality of functional gate structures 71, and may include, for example, silicon dioxide ($SiO_2$), silicon nitride ($Si_3N_4$) and/or silicon oxynitride (SiON). The gate capping layer may have a thickness in a range from about 5 nm to about 20 nm.

The plurality of base contacts 72 for BJT may be spaced apart in the first direction (X direction) and extending parallelly in the second direction (Y direction) crossing the plurality of fin-type bases 41 in the BJT region. The plurality of base contacts 72 may each include, for example, silicon (Si), germanium (Ge), InGaAs p+, or the like. The plurality of base contacts 72 may each also include two or more different materials such as InGaAs p+ on the bottom and metal such as tungsten (W), aluminum (Al), or titanium (Ti) on the top. The plurality of base contacts 72 may each have a width in a range from about 10 nm to about 300 nm, a height in a range from about 10 nm to about 160 nm, and a pitch from about 20 nm to about 300 nm. In an exemplary embodiment of the present invention, a base contact capping layers 34 may be formed on top of each of the plurality of base contacts 72, and may include, for example, silicon dioxide ($SiO_2$), silicon nitride ($Si_3N_4$) and/or silicon oxynitride (SiON). The base contact capping layer may have a thickness in a range from about 5 nm to about 20 nm.

The source 14 and the drain 14 for the FinFET may be formed on opposite sides of each of the plurality of functional gate structures 71 in the FET region. Referring to FIG. 5D, the source 14 and the drain 14 are formed before RMG. For NMOS FinFETs, the source and drains 14 may be made of, for example, silicon or silicon carbide including N-dopants of antimony (Sb), arsenic (As) or phosphorous (P). For PMOS FinFETs, the source and drains 14 may be made of, for example, silicon or silicon germanium including P-dopants of boron (B), aluminum (Al), gallium (Ga) or indium (In).

The collector 42a and the emitter 42b for the BJT may be formed on opposite sides of each of the plurality of base contacts 72 in the BJT region. The collector 42a and the emitter 42b may each include a III-V semiconductor including at least one of group III elements of boron (B), gallium (Ga), aluminum (Al) and indium (In), and at least one of group V elements of nitrogen (N), phosphorus (P), arsenic (As), antimony (Sb) and bismuth (Bi). Each of the plurality of fin-type bases 41 and the emitter 42b may include the same III-V semiconductor. Alternatively, each of the plurality of fin-type bases 41 and the emitter 42b may include different III-V semiconductors. For example, each of the plurality of fin-type bases 41 may include InGaAs, and the emitter 42b may include GaAs. The collector 42a and the emitter 42b may include the same III-V semiconductors. Alternatively, the collector 42a and the emitter 42b may include different III-V semiconductors. For example, the collector 42a may include InGaAs, and the emitter 42b may include GaAs. BJT in the BiCMOS structure may be manufactured in two types, NPN and PNP. For the NPN BJT, each of the plurality of fin-type bases 41 may include a P-type III-V semiconductor, and the collector 42a and the emitter 42b may include N-type III-V semiconductors. They may be heavily doped, for example, the collector 42a may include an InGaAs n+, and the emitter 42b may include GaAs n+. On the other hand, for the PNP BJT, the collector 42a and the emitter 42b may be P-doped. They may be heavily doped, for example, the collector 42a may include an InGaAs p+ and the emitter 42b may include GaAs p+.

In an exemplary embodiment of the present invention, a plurality of second spacers 33 may be formed on sidewalls of the plurality of base contacts 72 in the BJT region. The second spacers 33 may include, for example, silicon oxide ($SiO_2$), silicon nitride ($Si_3N_4$), boron nitride (BN), amorphous carbon (a-C), metal, and/or metal oxide, and may have a thickness ranging from about 4 nm to about 20 nm. The plurality of functional gate structures 71 and the plurality of base contacts 72 spaced may be surrounded by an ILD material 23. The ILD material 23 may include, for example, tetraethyl orthosilicate (TEOS), silicon nitride ($Si_3N_4$), silicon oxide ($SiO_2$), silicon oxynitride (SiON), nanoporous silica, hydrogensilsesquioxanes (HSQ), Teflon-AF (polytetrafluorethylene or PTFE), silicon oxyfluoride (FSG), carbon doped $SiO_2$ (SiCO), hydrogenated silicon oxycarbide (SiCOH), or other low k dielectric materials. The ILD material 23 may include a dielectric material the same as that of the insulating layer 20.

As described above, exemplary embodiments of the present invention provide a method of performing the lateral growth of the III-V semiconductors to form the base, the collector and the emitter for fabricating BJT in the BJT region after finished the RMG process step to form FinFET in the FET region, so that the base, the collector and the emitter, which include III-V semiconductors, would not incur damage due to the high temperature process steps used in fabricating the silicon device, and also provide a semiconductor structure having the base, the collector and the emitter of the BJT formed of III-V semiconductors in the BJT region.

Although illustrative embodiments of the present invention have been described in detail, it should be understood that the present invention is not intended to be limited to the specific embodiments disclosed. Based on the foregoing disclosure, those skilled in the art will be able to make various changes, substitutions and alterations without departing from the spirit and scope of the present invention as defined by the following appended claims.

What is claimed is:

1. A method of manufacturing a semiconductor structure comprising:
   providing a substrate having mandrels in a bipolar junction transistor (BJT) region, and fins in a field effect transistor (FET) region, the mandrels and the fins extending in a first direction and spaced apart in a second direction crossing the first direction;
   forming first spacers on sidewalls of the mandrels in the BJT region;
   forming sacrificial gate structures extending in the second direction crossing the mandrels in the BJT region, and crossing the fins in the FET region;
   forming source/drain structures on exposed sidewalls of the fins in the FET region;
   forming an interlayer dielectric (ILD) material to cover the sacrificial gate structures and the source/drain structures in the BJT and FET regions;
   forming functional gate structures to replace the sacrificial gate structures in the FET region;
   forming first III-V semiconductor patterns on the sidewalls of the mandrels to replace the first spacers in the BJT region;
   forming second III-V semiconductor patterns on sidewalls and tops of the first III-V semiconductor patterns and between the sacrificial gate structures in the BJT region; and
   forming base contacts to replace the sacrificial gate structures and the mandrels covered by the sacrificial gate structures in the BJT region.

2. The method of claim 1, wherein the forming of the first III-V semiconductor patterns in the BJT region is performed after the forming of the functional gate structures in the FET region.

3. The method of claim 1, wherein the first III-V semiconductor patterns comprise a first III-V semiconductor, the second III-V semiconductor patterns comprise a second III-V semiconductor, and the first III-V semiconductor is different from the second III-V semiconductor.

4. The method of claim 3, wherein the first III-V semiconductor is N-type and the second III-V semiconductor is P-type, or the first III-V semiconductor is P-type and the second III-V semiconductor is N-type.

5. The method of claim 1, wherein the second III-V semiconductor patterns comprise two different III-V semiconductors on opposite sides of each of the base contacts.

6. The method of claim 1, wherein the first III-V semiconductor patterns are bases of bipolar junction transistors (BJTs), and each of the second III-V semiconductor patterns is one of a collector and an emitter of one of the BJTs.

7. The method of claim 1, wherein the forming of the functional gate structures in the FET region comprises:
   removing the ILD material above the sacrificial gate structures in the FET region;
   removing the sacrificial gate structures in the FET region to form cavities; and depositing the functional gate structures in the cavities.

8. The method of claim 1, wherein the forming of the first III-V semiconductor patterns comprises:
   recessing the ILD material between the sacrificial gate structures in the BJT region;

isotropically etching away the first spacers from the sidewrels of the mandrels in the BJT region; and growing the first III-V semiconductor patterns on the sidewalls of the mandrels in the BJT region.

9. The method of claim 1, wherein the forming of the second III-V semiconductor patterns comprises:

performing mandrel pull between the sacrificial gate structures in collector/emitter area in the BJT region; and epitaxially growing the second III-V semiconductor patterns on the sidewalls and the tops of the first III-V semiconductor patterns between the sacrificial gate structures in the collector/emitter area in the BJT region.

10. The method of claim 9, wherein the forming of the second III-V semiconductor patterns further comprises forming second spacers on exposed sidewalls of the sacrificial gate structures and exposed sidewalls of the mandrels.

11. The method of claim 1, wherein the forming of the base contacts in the BJT region comprises:

depositing the ILD material over the substrate to fill all spaces among the mandrels, the sacrificial gate structures, and the first and second III-V semiconductor patterns;

planarizing top surface of the ILD material;

recessing the top surface of the ILD material to access the sacrificial gate structure in the BJT region;

removing the sacrificial gate structures in the BJT region;

performing mandrel pull to remove all remaining mandrels in the BJT region; and depositing the base contacts to fill spaces after mandrel pull, and planarizing top surfaces of the base contacts.

12. A method of manufacturing a semiconductor structure comprising:

providing a substrate including a field effect transistor (FET) region and a bipolar junction transistor (BJT) region;

forming a plurality of fins in the FET region on the substrate extending in a first direction and spaced apart in a second direction crossing the first direction, a plurality of functional gate structures spaced apart in the first direction and extending in the second direction crossing the plurality of fins in the FET region, a source and a drain formed on opposite sides of each of the plurality of functional gate structures in the FET region, a plurality of mandrels having first spacers on sidewalls in the BJT region on the substrate extending in the first direction and spaced apart in the second direction, and a plurality of sacrificial gate structures spaced apart in the first direction and extending in the second direction crossing the plurality of mandrels in the BJT region, and an interlayer dielectric (ILD) material covering the plurality of the sacrificial gate structures, the sources and the drains in the BJT and FET regions;

forming a plurality of fin-type bases on the sidewalls of the plurality of mandrels to replace the first spacers in the BJT region, while masking the FET region;

forming a collector and an emitter on sidewalls and tops of each of the plurality of fin-type bases at opposite sides of each of the plurality of sacrificial gate structures in the BJT region; and forming a plurality of base contacts to replace the plurality of sacrificial gate structures and the plurality of mandrels covered by the plurality of sacrificial gate structures in the BJT region, wherein the plurality of fins comprise a group IV semiconductor, and the plurality of fin-type bases comprise a III-V semiconductor including at least one of group III elements of boron (B), gallium (Ga), aluminum (Al) and indium (In), and at least one of group V elements of nitrogen (N), phosphorus (P), arsenic (As), antimony (Sb) and bismuth (Bi).

13. The method of claim 12, wherein each of the plurality of fin-type bases comprises a P-type III-V semiconductor, and the collector and the emitter comprise N-type III-V semiconductors, or each of the plurality of fin-type bases comprises an N-type III-V semiconductor, and the collector and the emitter comprise P-type III-V semiconductors.

14. The method of claim 12, wherein the forming of the collector and the emitter further comprises forming a plurality of second spacers on exposed sidewalls of the plurality of sacrificial gate structures and exposed sidewalls of the plurality of mandrels.

15. The semiconductor structure of claim 12, wherein each of the plurality of fin-type bases comprises InGaAs, the collector comprises InGaAs, and the emitter comprises GaAs.

16. A semiconductor structure comprising:

a substrate including a field effect transistor (FET) region and a bipolar junction transistor (BJT) region;

a plurality of fins in the FET region and a plurality of fin-type bases in the BJT region on the substrate extending in a first direction and spaced apart in a second direction crossing the first direction;

a plurality of functional gate structures spaced apart in the first direction and extending in the second direction crossing the plurality of fins in the FET region, and a plurality of base contacts spaced apart in the first direction and extending in the second direction crossing the plurality of fin-type bases in the BJT region; and a source and a drain formed on opposite sides of each of the plurality of functional gate structures in the FET region, and a collector and an emitter formed on opposite sides of each of the plurality of base contacts in the BJT region, wherein the plurality of fins comprise a group IV semiconductor, and the plurality of fin-type bases comprise a III-V semiconductor including at least one of group III elements of boron (B), gallium (Ga), aluminum (Al) and indium (In), and at least one of group V elements of nitrogen (N), phosphorus (P), arsenic (As), antimony (Sb) and bismuth (Bi).

17. The semiconductor structure of claim 16, wherein the emitter and each of the plurality of fin-type bases comprise different III-V semiconductors.

18. The semiconductor structure of claim 16, wherein each of the plurality of fin-type bases comprises a P-type III-V semiconductor, and the collector and the emitter comprise N-type III-V semiconductors.

19. The semiconductor structure of claim 16, wherein each of the plurality of fin-type bases comprises an N-type III-V semiconductor, and the collector and the emitter comprise P-type III-V semiconductors.

20. The semiconductor structure of claim 16, wherein each of the plurality of fin-type bases comprises InGaAs, the collector comprises InGaAs, and the emitter comprises GaAs.

* * * * *